(12) United States Patent
Ogawa et al.

(10) Patent No.: US 6,995,415 B2
(45) Date of Patent: Feb. 7, 2006

(54) SEMICONDUCTOR DEVICE AND ITS MANUFACTURING METHOD

(75) Inventors: Hisashi Ogawa, Katano (JP); Hiroaki Nakaoka, Kyotanabe (JP); Atsuhiro Kajiya, Sanda (JP); Shin Hashimoto, Hirakata (JP); Kyoko Egashira, Takaoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 39 days.

(21) Appl. No.: 10/475,115

(22) PCT Filed: Feb. 14, 2003

(86) PCT No.: PCT/JP03/01603

§ 371 (c)(1),
(2), (4) Date: Oct. 17, 2003

(87) PCT Pub. No.: WO03/069676

PCT Pub. Date: Aug. 21, 2003

(65) Prior Publication Data

US 2004/0137667 A1    Jul. 15, 2004

(30) Foreign Application Priority Data

Feb. 14, 2002   (JP) .............................. 2002-036084

(51) Int. Cl.
*H01L 27/108*   (2006.01)

(52) U.S. Cl. ...................................... 257/296

(58) Field of Classification Search ................ 257/288, 257/296, 300, 301, 303, 306

See application file for complete search history.

(56) References Cited

FOREIGN PATENT DOCUMENTS

| EP | 181162 | 5/1986 |
|---|---|---|
| EP | 1039470 | 9/2000 |
| JP | 82-134963 | 6/1987 |
| JP | 63-24657 | 2/1988 |
| JP | 6-302778 | 10/1994 |
| JP | 11-284146 | 10/1999 |

*Primary Examiner*—Scott Geyer
(74) *Attorney, Agent, or Firm*—McDermott Will & Emery LLP

(57) ABSTRACT

A memory cell transistor and a planar capacitor are provided in a memory region, and both transistors of a CMOS device are provided in a logic circuit region. A capacitance dielectric 15 and a plate electrode 16b of the planar capacitor are provided over a trench shared with a shallow trench isolation 12a, and the upper part of the trench is filled with the capacitance dielectric 15 and the plate electrode 16b. An n-type diffusion layer 19 that is a storage node is formed, with an end region thereof extending along one side of the upper part of the trench, to a region of the substrate overlapping with the shallow trench isolation 12a. The area of a part of the substrate functioning as a capacitor can be increased without increasing the substrate area.

11 Claims, 15 Drawing Sheets

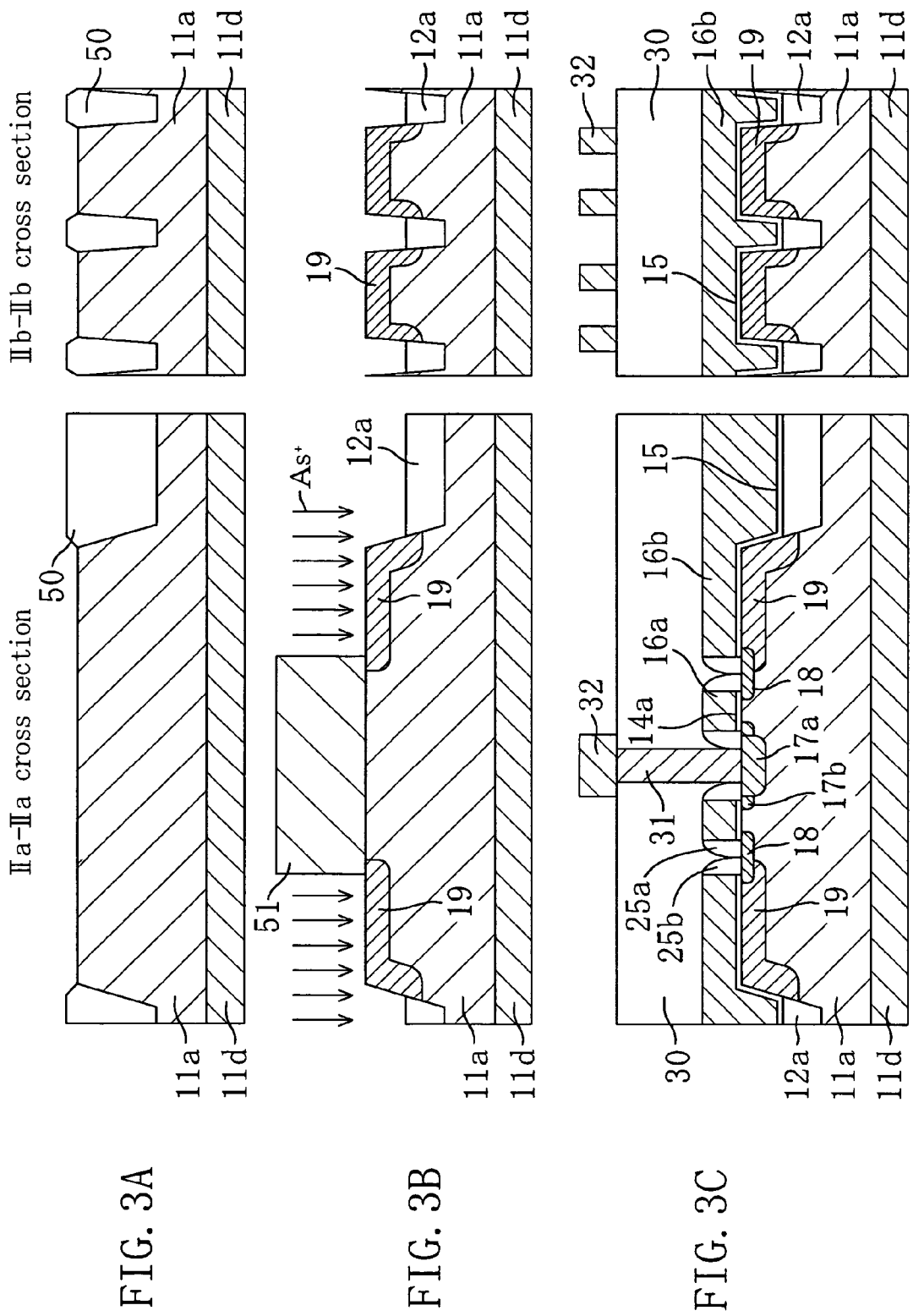

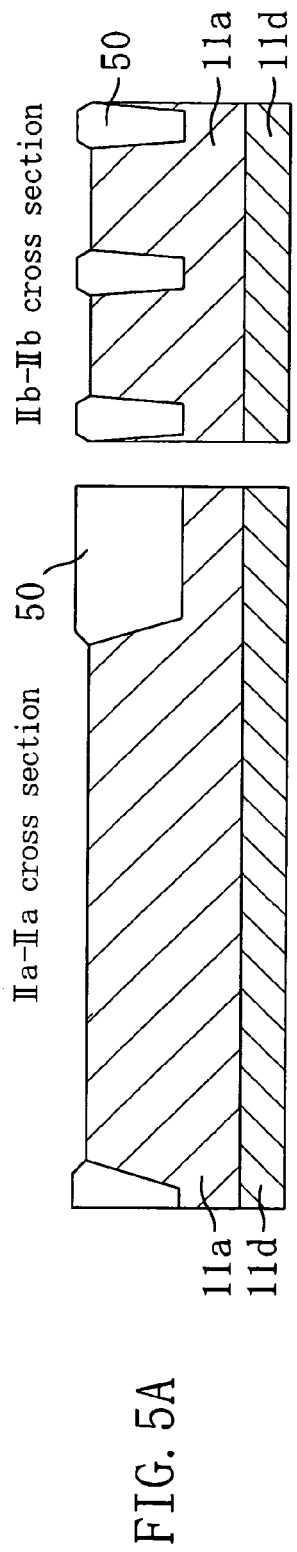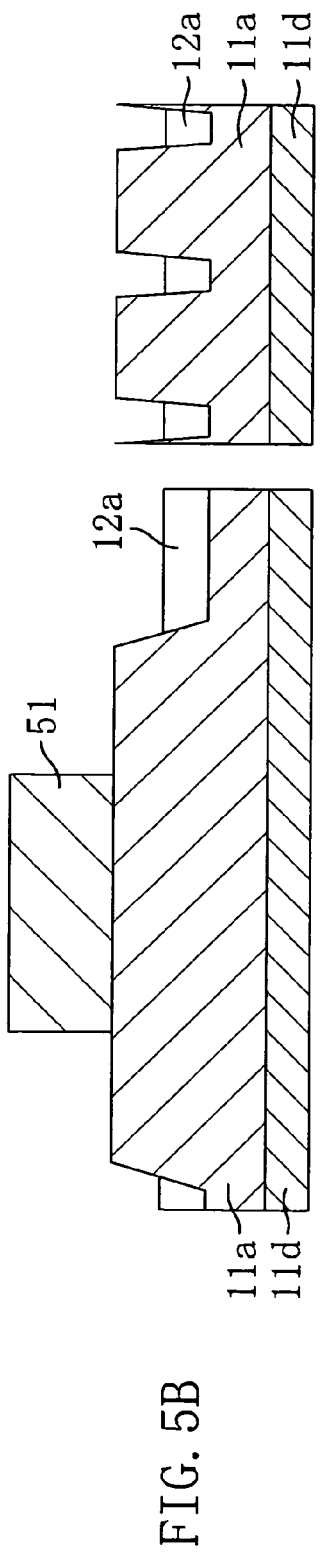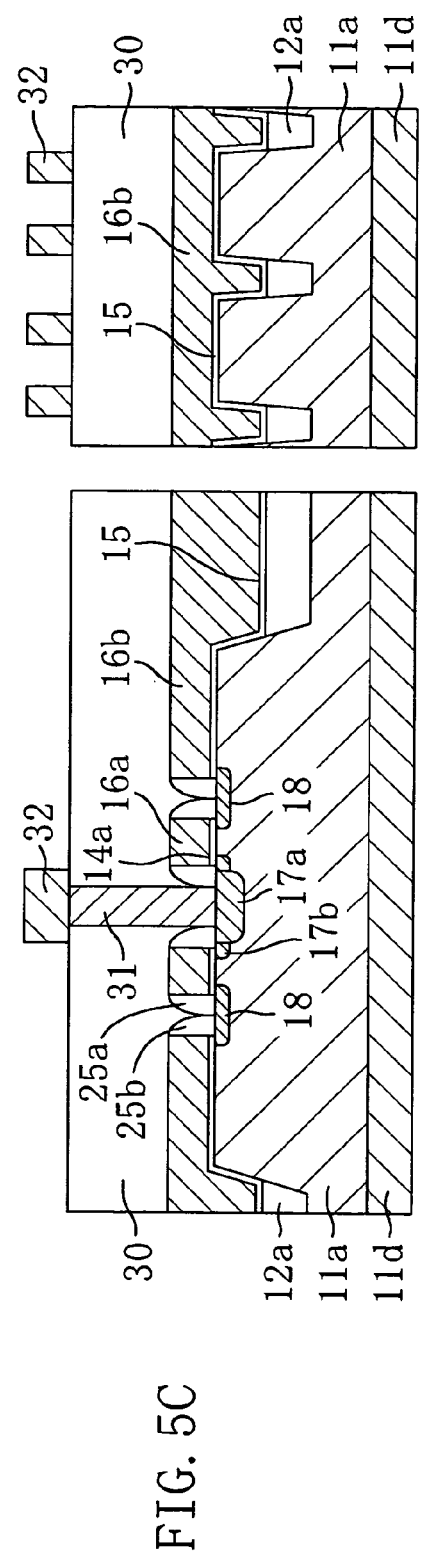

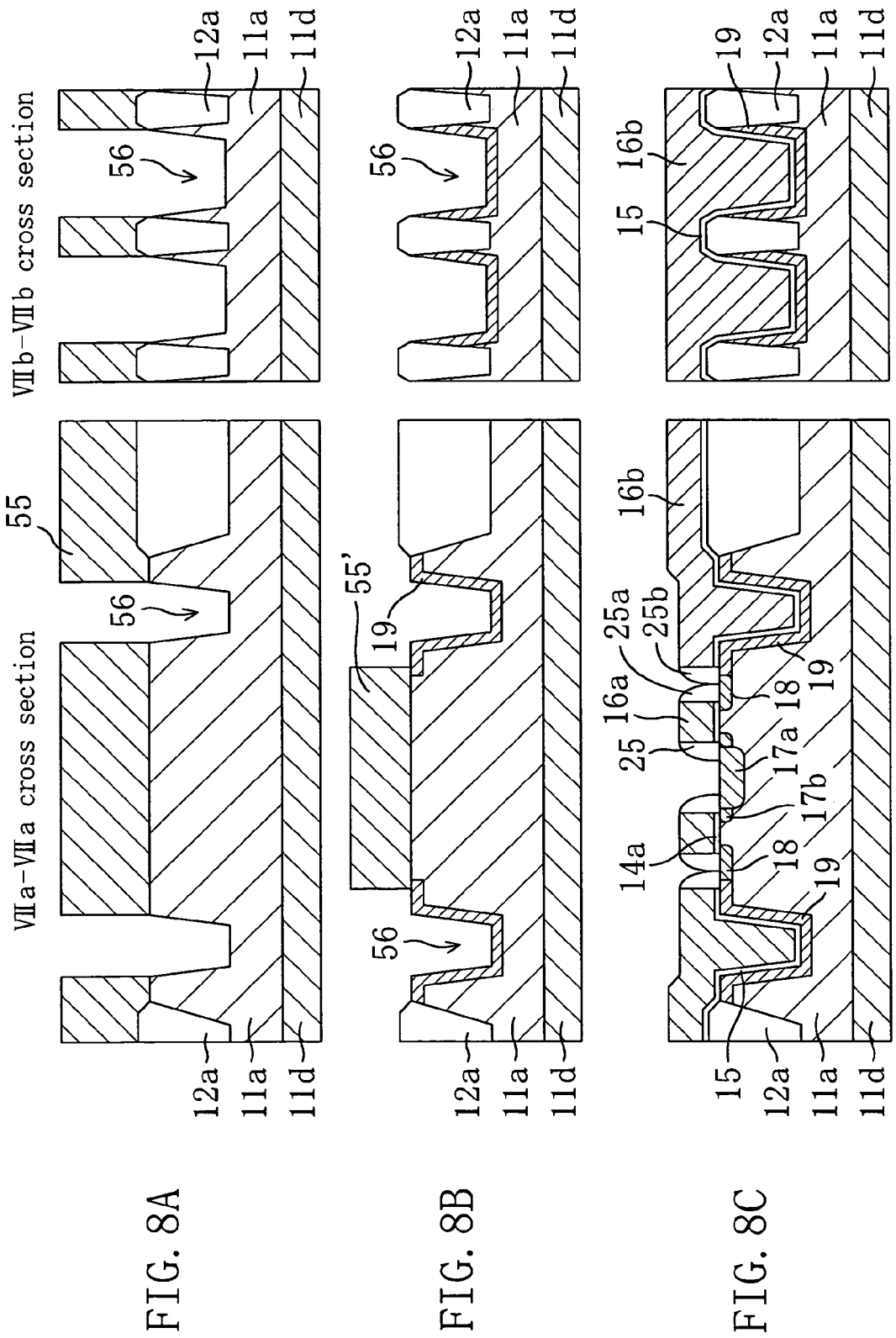

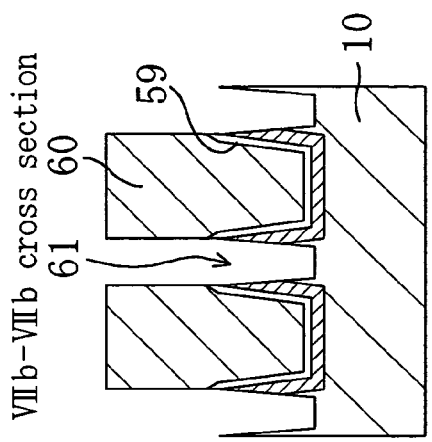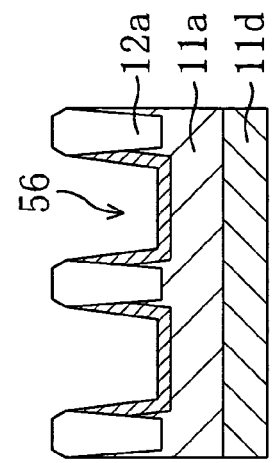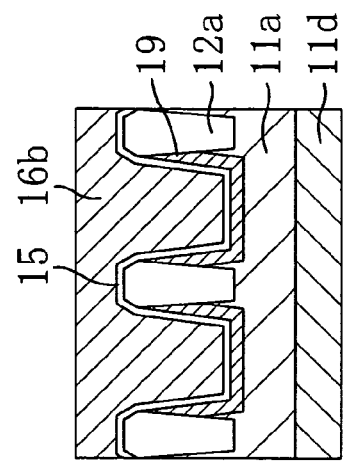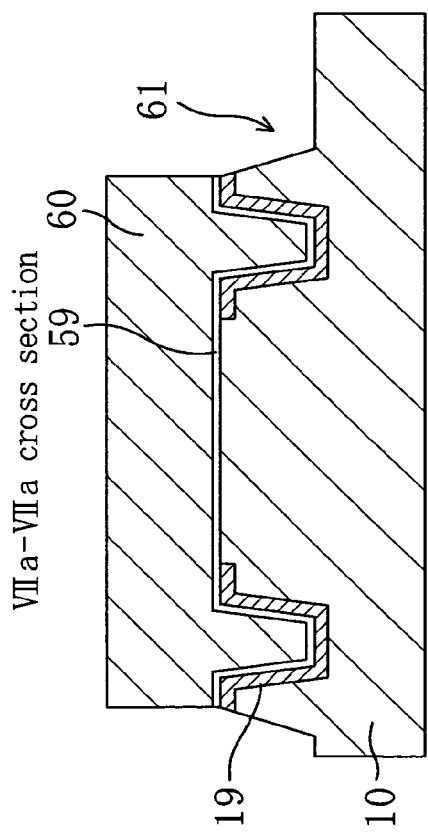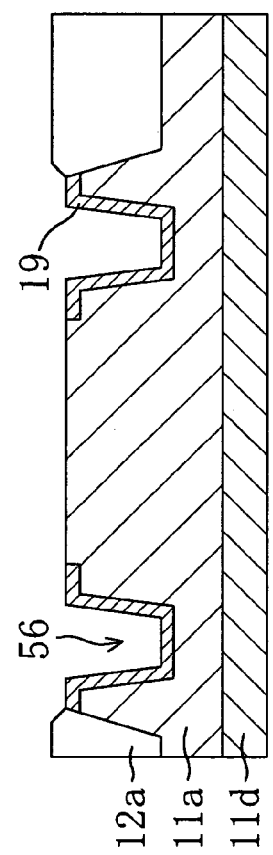
FIG. 9A   FIG. 9B   FIG. 9C

SEMICONDUCTOR DEVICE AND ITS MANUFACTURING METHOD

TECHNICAL FIELD

The present invention relates to a semiconductor storage device and a method for fabricating the same, and more particularly to those that are applied to a so-called DRAM-embedded logic LSI in which a DRAM is embedded in a logic chip.

BACKGROUND ART

In recent years, DRAM-embedded devices in which a high-performance logic circuit and a DRAM memory are combined together have been made practical for multimedia devices requiring miniaturization, a high memory capacity and a high data transfer rate. The DRAM-embedded devices are broadly classified into a trench capacitor type in which a capacitor as an information storage unit of a DRAM memory cell is provided in a trench of a semiconductor substrate and a stack capacitor type in which a capacitor and an electrode are three-dimensionally stacked above a principal surface of a semiconductor substrate.

On the other hand, attention is again focused on a device in which a so-called planar (MOS structure) DRAM and a logic circuit are merged using a gate dielectric as a capacitance dielectric and a gate electrode as a plate electrode, because it is a device in which a memory cell can be formed more easily.

Problems to be Solved

However, the above-described known merged DRAM/logic devices have the following problems.

Processes for fabricating the trench-capacitor-type and stack-type merged DRAM/logic devices additionally involve complicated process steps to form a memory cell capacitor as well as a memory cell transistor. Consequently, the yield enhancement of the devices becomes increasingly difficult in addition to prolonging the development period for design changes or the like and the period required for fabrication of the devices, leading to an increase in production cost.

In regard to a planar-type merged DRAM/logic device, although a process for fabricating the same is short and simple, the size of the memory cell becomes larger than that of the stack capacitor type or the trench capacitor type. Therefore, it becomes hard to obtain a denser semiconductor device while embedding a high-capacity DRAM in a logic circuit.

DISCLOSURE OF INVENTION

It is an object of the present invention to provide a DRAM capable of increasing the capacitance of a capacitor without increasing the substrate area, or a semiconductor device in which this DRAM and a logic circuit are merged, and a method for fabricating the same.

A semiconductor device of the present invention comprises: a semiconductor substrate; a recess formed in the semiconductor substrate; a memory cell transistor including a gate electrode and a gate dielectric provided on the semiconductor substrate and source and drain diffusion layers provided at either side of the gate electrode in the semiconductor substrate; and a capacitor including a plate electrode formed of a conductor film in common with the gate electrode of the memory cell transistor so as to lie over the top surface of the semiconductor substrate and at least a part of the surface of the recess, and a capacitance dielectric provided below the plate electrode.

Thereby, a semiconductor device comprising a planar capacitor or a trench capacitor including a plate electrode lying over the top surface of the semiconductor substrate and into the recess can be obtained. Since the plate electrode is formed of a conductor film in common with the gate electrode of the memory cell transistor, this reduces a step height in the whole semiconductor device and facilitates the formation of a fine structure. Therefore, a semiconductor device including a storage capacitor suitable for an increase in density can be obtained.

The capacitor can further include a diffusion layer for a storage node that is of a conductive type identical with that of each of the source and drain diffusion layers, formed so as to be opposed to the plate electrode with the capacitance dielectric sandwiched therebetween in the semiconductor substrate, and connected to either of the source and drain diffusion layers of the memory cell transistor.

The lower part of the recess is filled with a dielectric, and the plate electrode and the capacitance dielectric are formed on the dielectric in the recess. Therefore, the area of a part of the substrate functioning as the capacitance of the capacitor is increased by part of the sides of the recess without increasing the substrate area. Thus, a structure suitable for an increase in density can be obtained.

The dielectric in the recess functions as an isolation dielectric. Therefore, a part of the isolation is shared also with a capacitor, thereby obtaining a structure suitable for an increase in density.

The recess may be filled with the plate electrode and the capacitance dielectric. In this case, the total thickness of the conductor film of which the plate electrode is formed and the capacitance dielectric is one-half or more of the width of the recess. Therefore, the top surface of the conductor film is planarized above the recess. Thus, a memory cell transistor including a fine gate electrode with a high patterning accuracy can be obtained.

The semiconductor device further comprises an upper dielectric provided on the conductor film for forming the plate electrode, wherein the total thickness of the upper dielectric, the conductor film of which the plate electrode is formed and the capacitance dielectric is one-half or more of the width of the recess. Therefore, also when an antireflection coating and a hard mask are to be provided, the flatness of a portion of the upper dielectric located above the recess can be maintained.

The capacitance dielectric and the gate dielectric of the memory cell transistor may be formed of a common film or may be formed of different films, respectively.

When the semiconductor device further comprises logic transistors each including a gate electrode and a gate dielectric provided on the semiconductor substrate and source and drain diffusion layers formed in the semiconductor substrate, the plate electrode of the capacitor, the gate electrode of the memory cell transistor and the gate electrodes of the transistors located in the logic circuit are all preferably formed of a common conductor film.

A first method for fabricating a semiconductor device of the present invention comprising a semiconductor substrate, a memory cell transistor including a gate electrode and source and drain diffusion layers and a capacitor including a plate electrode and a capacitance dielectric comprises the steps of (a) forming a trench in the top surface region of the semiconductor substrate; (b) forming a first dielectric with which the trench is filled; (c) removing the upper part of a part of the first dielectric; (d) forming a second dielectric and a conductor film covering the second dielectric to the inside of the trench and over the top surface of the semiconductor substrate after the step (c); and (e) patterning the conductor film to form the gate electrode of the memory cell transistor and the plate electrode of the capacitor.

According to this method, part of the sides of the trench functions as a capacitor. Therefore, a semiconductor device including a planar capacitor with a high capacitance density per substrate area can be obtained.

The method for fabricating a semiconductor device can further comprise the step of doping a region of the semiconductor substrate located along a part of the top surface thereof and the exposed sides of the trench with impurities to form an impurity diffusion layer that becomes a storage node of the capacitor.

In the step (d), after an oxide film and a nitride film are successively stacked as the second dielectric, the nitride film is oxidized to form the capacitance dielectric consisting of a multilayer film of oxide, nitride and oxide films, and the surface of the semiconductor substrate is oxidized to form the gate dielectric of the memory cell transistor, and in the step (e), the conductor film is formed on the capacitance dielectric and the gate dielectric. Therefore, the gate electrode and the plate electrode can be formed of a common conductor film while the materials of the gate dielectric and the capacitance dielectric are different from each other.

When the semiconductor device further comprises logic transistors each including a gate electrode and source and drain diffusion layers, in the step (a), an isolation trench is formed in the logic transistor formation region, in the step (b), the trench located in the logic transistor formation region is filled with the first dielectric, and in the step (c), the first dielectric with which the trench in the logic transistor formation region is filled is left as it is. Therefore, a capacitor utilizing the isolation trench can be formed and simultaneously the isolation for the logic transistors can be formed, resulting in a simplification of the process step and a denser semiconductor device.

A second method for fabricating a semiconductor device of the present invention comprising a semiconductor substrate, a memory cell transistor including a gate electrode and source and drain diffusion layers, and a capacitor including a plate electrode and a capacitance dielectric comprises the steps of: (a) forming a trench in the top surface region of the semiconductor substrate; (b) forming a second dielectric and a conductor film covering the second dielectric to the inside of the trench and over the top surface of the semiconductor substrate; and (c) patterning the conductor film to form the gate electrode of the memory cell transistor and the plate electrode of the capacitor, wherein in the step (b), the total thickness of the second dielectric and the conductor film is larger than one-half of the width of the trench.

According to this method, when the trench capacitor is formed, a portion of the top surface of the conductor film located above the trench is planarized in the step (b). Therefore, the patterning accuracy of the conductor film in the step (c) is enhanced.

In the step (b), after an oxide film and a nitride film are successively stacked as the second dielectric, the nitride film is oxidized to form the capacitance dielectric consisting of a multiplayer film of oxide, nitride and oxide films, and the surface of the semiconductor substrate is oxidized to form the gate dielectric of the memory cell transistor, and in the step (c), the conductor film is formed on the capacitance dielectric and the gate dielectric. Therefore, the gate electrode and the plate electrode can be formed of a common conductor film while the materials of the gate dielectric and the capacitance dielectric are different from each other.

The method for fabricating a semiconductor device further comprises the step of forming a trench isolation consisting of an oxide film before the step (a), wherein in the step (a), the trench is formed by etching the semiconductor substrate using a resist mask having an opening across part of the trench isolation over plural active regions. Therefore, the alignment of the resist mask becomes unnecessary, resulting in simplifying the process step.

BRIEF DESCRIPTION OF DRAWINGS

FIGS. 3A through 3C are cross sectional views illustrating a first method for fabricating a semiconductor device according to the first embodiment.

FIGS. 5A through 5C are cross sectional views illustrating process steps for fabricating a semiconductor device according to a modification of the first embodiment.

FIGS. 8A through 8C are cross sectional views illustrating process steps for fabricating a semiconductor device according to the second embodiment.

FIGS. 9A through 9C are cross sectional views illustrating a modification of a method for fabricating a semiconductor device according to this embodiment.

BEST MODE FOR CARRYING OUT THE INVENTION

Embodiment 1

Figure 1:
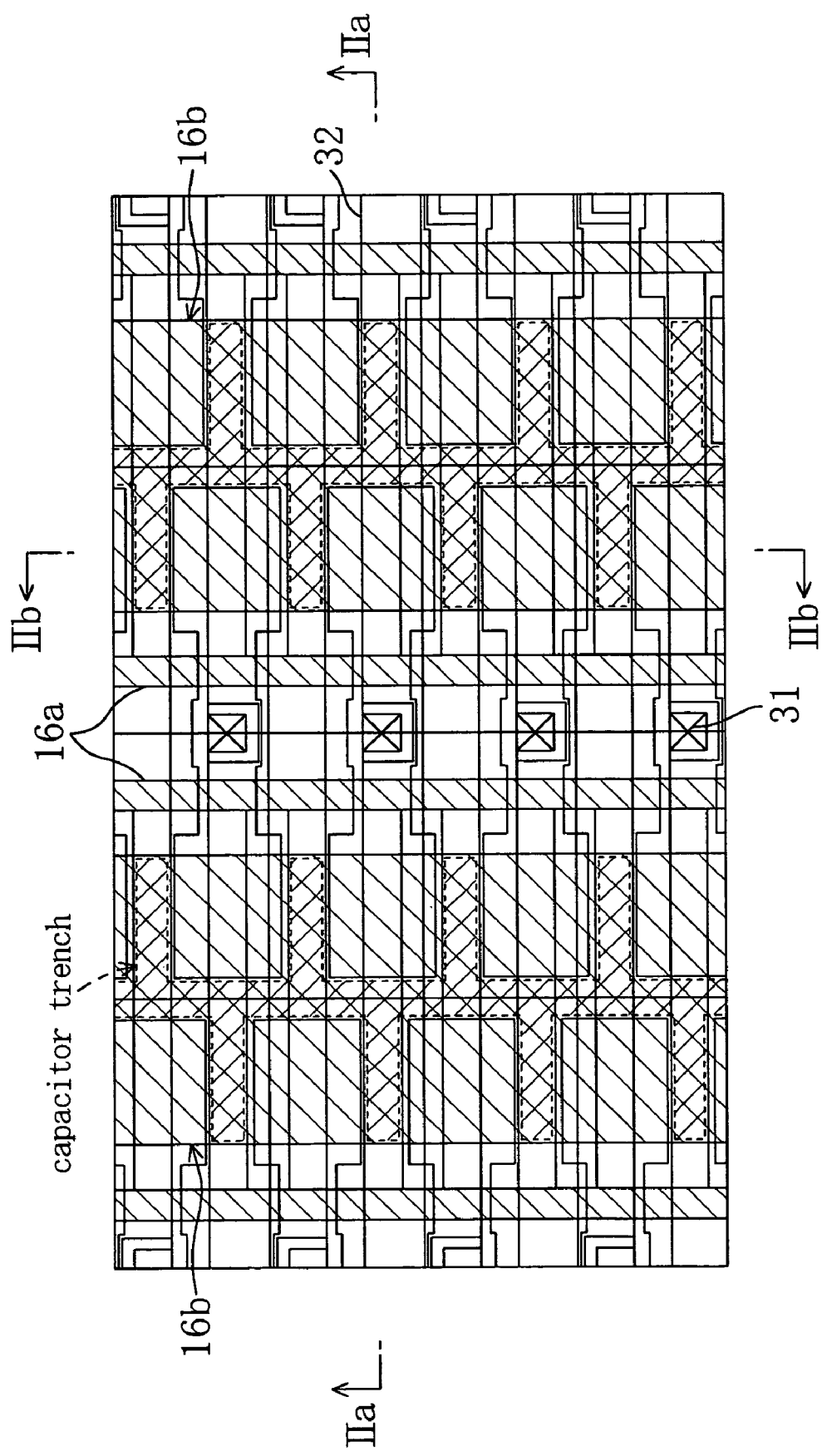
FIG. 1 is a plan view illustrating the structure of a memory of a semiconductor device according to a first embodiment of the present invention.
Figures 2A, 2B:
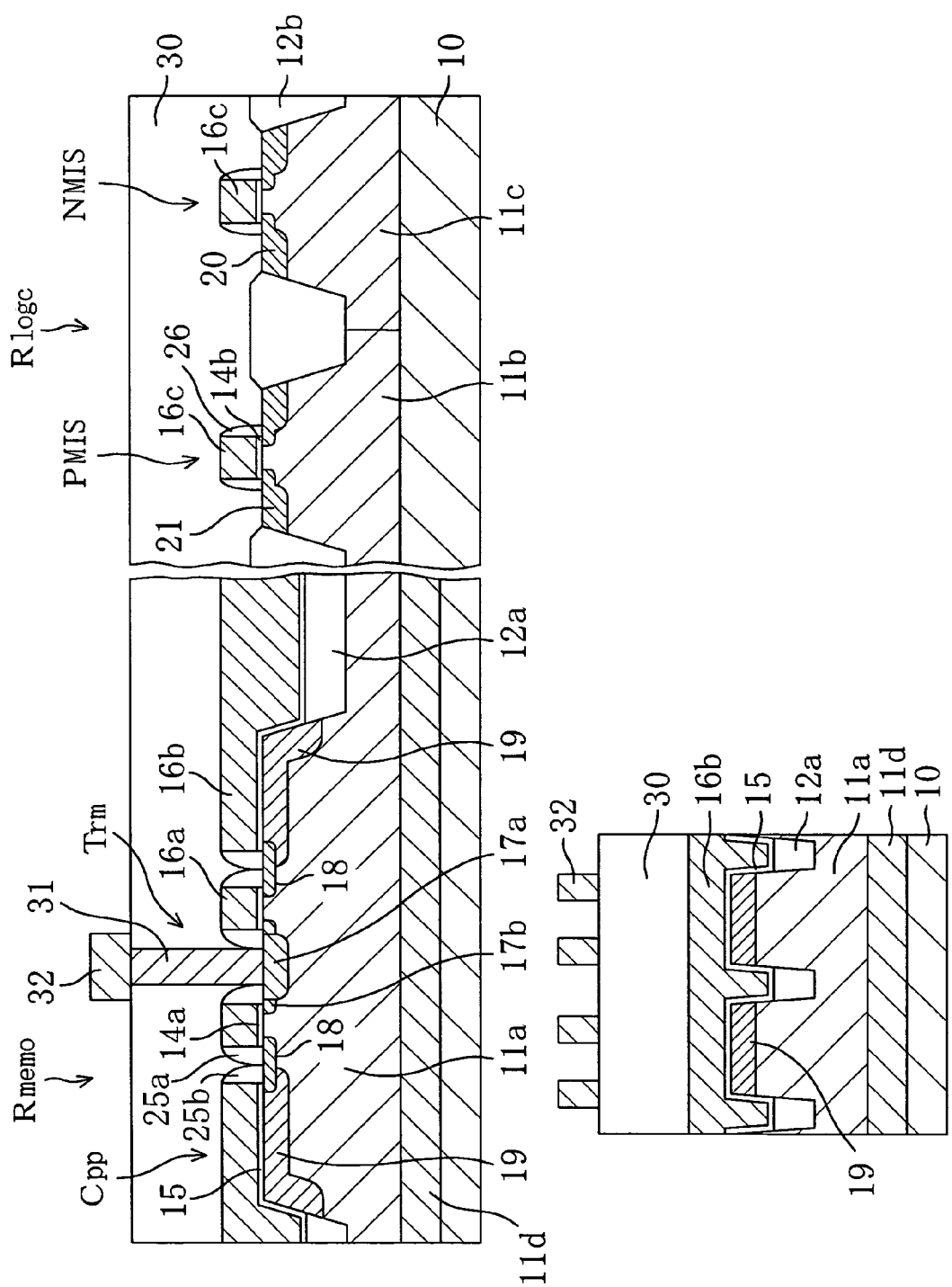
FIGS. 2A and 2B are cross sectional views taken along the lines Ia—Ia and IIb—IIb shown in FIG. 1, respectively.

FIG. 1 is a plan view illustrating the structure of a memory of a semiconductor device according to a first embodiment of the present invention. FIGS. 2A and 2B are cross sectional views taken along the lines IIa—IIa and IIb—IIb shown in FIG. 1, respectively. Although FIG. 2A illustrates cross sectional structures of a memory region Rmemo and a logic circuit region Rlogc of the semiconductor device, FIGS. 1 and 2B do not illustrate the cross sectional structure of the logic circuit region Rlogc.

As shown in FIGS. 1, 2A and 2B, the semiconductor device of this embodiment includes a p-type silicon substrate 10, a p-well 11a provided in the memory region Rmemo of the silicon substrate 10, an n-well 11b and a p-well 11c both provided in the logic circuit region Rlogc of the silicon substrate 10, and a deep n-well 11d surrounding the bottom part of the p-well 11a located in the memory region Rmemo, i.e., the device has a so-called triple-well structure. The device comprises a shallow trench isolation 12a defining an active region in the memory region Rmemo and a shallow trench isolation 12b defining an active region in the logic circuit region Rlogc.

In the memory region Rmemo, a memory cell transistor Trm including a gate electrode 16a, a gate dielectric 14a, a dielectric sidewall 25a, a low-concentration drain diffusion layer 17b containing n-type impurities with low concentration, a high-concentration drain diffusion layer 17a containing n-type impurities with high concentration, and a source diffusion layer 18 and a planar capacitor Cpp including a plate electrode 16b, an n-type diffusion layer 19 functioning as a storage node, a capacitance dielectric 15, and a dielectric sidewall 25b are arranged on the p-well 11a. Thus, a drain diffusion layer of the memory cell transistor is composed of the high-concentration drain diffusion layer 17a and the low-concentration drain diffusion layer 17b. On the other hand, the source diffusion layer 18 is composed of only a low-concentration impurity diffusion layer containing n-type impurities with low concentration as a whole.

The capacitance dielectric 15 and the plate electrode 16b of the planar capacitor Cpp are arranged on the silicon substrate 10 and to the inside of the trench shared with the shallow trench isolation 12a so that the upper part of the trench is filled with the capacitance dielectric 15 and the plate electrode 16b. The n-type diffusion layer 19 is formed, with an end region thereof extending along one side of the upper part of the trench, to regions of the substrate overlapping with the shallow trench isolation 12a and the source diffusion layer 18.

In the logic circuit region Rlogc, there are provided a p-channel type MIS transistor (pMIS) including a gate electrode 16c, a gate dielectric 14b, a dielectric sidewall 26, and p-type source/drain diffusion layers 21 and an n-channel type MIS transistor (nMIS) including a gate electrode 16c, a gate dielectric 14b, a dielectric sidewall 26, and n-type source/drain diffusion layers 20.

An inter-level dielectric 30 is deposited on the whole substrate. There are provided a bit-line contact 31 passing through the inter-level dielectric 30 and connected to the high-concentration drain diffusion layer 17a of the memory cell transistor Trm located in the memory region Rmemo, and a bit line 32 connected to the bit-line contact 31 and extending on the inter-level dielectric 30.

Also in the logic circuit region Rlogc, there are provided source and drain contacts passing through the inter-level dielectric 30 and reaching the source/drain diffusion layers 20 and 21, a gate contact passing through the inter-level dielectric 30 and coming into contact with the gate electrode 16c, and the like. However, since these members do not relate to the essence of the present invention, an illustration thereof is not given.

This embodiment is characterized in that the plate electrode 16b is formed of a conductor film (in this embodiment, a polysilicon film) in common with the gate electrode 16a of the memory cell transistor Trm, and that the capacitance dielectric 15 and the plate electrode 16b of the planar capacitor Cpp are provided to the inside of the trench shared with the shallow trench isolation 12a so that the upper part of the trench is filled in.

According to this embodiment, since the plate electrode 16b is formed of the conductor film in common with the gate electrode 16a of the memory cell transistor, it becomes possible to reduce the size of the memory cell.

In addition, according to this embodiment, only the lower part of the trench is filled with the shallow trench isolation 12a, and the upper part of the trench is filled with the capacitance dielectric 15 and the plate electrode 16b of the planar capacitor Cpp. Consequently, the n-type diffusion layer 19 (storage node) and the plate electrode 16b are opposed to each other with the capacitance dielectric 15 being sandwiched therebetween on the sides of the upper part of the trench, resulting in an increase in the capacitance of the capacitor by that of this part. That is, the planar capacitor of this embodiment is provided over the top surface of the silicon substrate 10 and part of the sides of the trench, whereby the area of a part of the substrate functioning as a capacitor can be increased without increasing the area of the substrate. This planar capacitor is constructed so as to increase its capacitance as a so-called merged planar/trench capacitor, thereby reducing the area of the substrate required for a memory function.

First Method for Fabricating Semiconductor Device of First Embodiment

Next, a description will be given of a first method for fabricating a semiconductor device according to the first embodiment of the present invention. FIGS. 3A through 3C are cross sectional views illustrating the first method for fabricating a semiconductor device according to this embodiment. However, FIGS. 3A through 3C illustrate only the memory region Rmemo, and the logic circuit region Rlogc is not shown therein. Referring to FIGS. 3A through 3C, a p-well 11a and a deep n-well 11d are formed in the silicon substrate 10. However, for convenience, a body of the silicon substrate 10 is not shown therein.

Initially, in a process step shown in FIG. 3A, an isolation trench for defining an active region is formed in the surface region of the silicon substrate 10 by a known method using an underlying oxide film and a nitride film mask. At this time, also in the logic circuit region Rlogc, the isolation trench is formed. Thereafter, the isolation trench is filled with the silicon oxide film so as to form an isolation dielectric 50. At this time, also in the logic circuit region Rlogc, an isolation 12b as shown in FIG. 2A is formed. Phosphorus ions ($P^+$) are implanted into the memory region Rmemo of the silicon substrate 10 by using a resist mask (not shown) covering a part of the logic circuit region Rlogc under conditions of an acceleration energy of 1200 keV and a dose amount of $3.0 \times 10^{12}$, thereby forming a deep n-well 11d (see FIG. 2A) in the bottom region of a p-well 11a located in the memory region Rmemo. Boron ions ($B^+$) are implanted into the memory region Rmemo and a part of the logic circuit region Rlogc of the silicon substrate 10 by using a resist mask (not shown) covering a p-channel type transistor formation region of the logic circuit region Rlogc under conditions of an acceleration energy of 250 keV and a dose amount of $1\times10^{13}$, thereby forming the p-well 11a located in the memory region Rmemo and a p-well 11c located in the logic circuit region Rlogc (see FIG. 2A). Phosphorus ions ($P^+$) are implanted by using a resist mask (not shown) covering the memory region Rmemo and the p-channel type transistor formation region located in the logic circuit region Rlogc under conditions of an acceleration energy of 250 keV and a dose amount of $1\times10^{13}$ $cm^{-2}$, thereby forming an n-well 11b (see FIG. 2A) in the logic circuit region Rlogc. In the memory region Rmemo and the logic circuit region Rlogc, impurities for channel stoppers are implanted immediately below the shallow trench isolations 12a and 12b, and impurities for punch-through stoppers are implanted below channel regions of the transistors, although they are not shown in FIG. 2A. As conditions thereof, well-known conditions can be used.

Although in this embodiment the deep n-well 11d, the p-wells 11a and 11c, and the n-well 11b are formed after the isolation trench and the isolation dielectric 50 are formed, these wells may be formed before the isolation trench and the isolation dielectric 50 are formed.

Next, in a process step shown in FIG. 3B, the upper part of the isolation dielectric 50 located only in the memory region Rmemo is selectively removed by wet etching using a resist mask 51 covering the whole logic circuit region Rlogc and a part of the active region located in the memory region Rmemo as a mask, thereby forming the shallow trench isolation 12a with the isolation trench and the lower part of the isolation dielectric 50 left. At this time, in the logic circuit region Rlogc, the isolation dielectric remains as the shallow trench isolation 12b (see FIG. 2A) as it is without being etched away. Arsenic ions ($As^+$) are implanted by using the resist mask 51 as an implantation mask as it is, thereby forming an n-type diffusion layer 19 serving as a storage node. At this time, the lateral size of the resist mask 51 is set such that a source diffusion layer 18 for a memory cell transistor and the n-type diffusion layer 19 for a planar capacitor Cpp overlap with each other.

Next, in a process step shown in FIG. 3C, an oxide film having a thickness of 2 through 6 nm, which serves as a capacitance dielectric 15 and a gate dielectric 14a both located in the memory region Rmemo and a gate dielectric 14b located in the logic circuit region Rlogc, is formed, and thereafter a polysilicon film having a thickness of 200 nm is deposited thereon.

Thereafter, the capacitance dielectric 15 and a plate electrode 16b of the planar capacitor and the gate dielectric 14a and a gate electrode 16a of the memory cell transistor are formed in the memory region Rmemo by patterning the polysilicon film and the oxide film. The gate dielectric 14b and a gate electrode 16c of each of the p-channel type MIS transistor and the n-channel type MIS transistor are formed in the logic circuit region Rlogc (see FIG. 2A), although they are not shown in FIG. 3C. Prior to the patterning of the polysilicon film, impurity ions may be implanted into parts of both the p-channel type MIS transistor and the n-channel type MIS transistor or a part of the p-channel type MIS transistor which are to become the gate electrodes made of the polysilicon film, so as to reduce the resistance of the gate electrodes.

Thereafter, low-concentration arsenic ions are implanted into the memory cell transistor located in the memory region Rmemo by using the gate electrode 16a and the plate electrode 16b as masks. Thereby, a low-concentration drain diffusion layer 17b and a source diffusion layer 18 are formed in the memory region Rmemo. At this time, the source diffusion layer 18 of the memory cell transistor is formed so as to overlap with an n-type diffusion layer 19 that is the storage node.

Next, a silicon oxide film and a silicon nitride film are successively deposited on the whole substrate, and thereafter a dielectric sidewall 25a is formed along the sides of the gate electrode 16a of the memory cell transistor by anisotropic etching. At this time, a dielectric sidewall 25b is formed also along the sides of the plate electrode 16b of the trench capacitor. The source diffusion layer 18 of the memory cell transistor is covered with the two dielectric sidewalls 25a and 25b. A dielectric sidewall 26 is formed also along the sides of the gate electrode 16c of each of the p-channel type MIS transistor and the n-channel type MIS transistor in the logic circuit region Rlogc (see FIG. 2A).

High-concentration arsenic ions are implanted into the n-channel type MIS transistors of the logic circuit region Rlogc and the memory region Rmemo. Thereby, source/drain diffusion layers 20 of the n-channel type MIS transistor are formed in the logic circuit region Rlogc. A high-concentration drain diffusion layer 17a is also formed in the memory region Rmemo. At this time, since the top of the source diffusion layer 18 is covered with the dielectric sidewalls 25a and 25b, high-concentration arsenic is not implanted in this layer, resulting in no high-concentration source diffusion layer being formed. In the logic circuit region Rlogc, high-concentration boron fluoride ions are implanted into the p-channel type MIS transistor by using the gate electrode 16c and the dielectric sidewall 26 as masks, thereby forming source/drain diffusion layers 21 of the p-channel type MIS transistor.

Thereafter, after a silicon oxide film having a thickness of 900 nm is deposited on the substrate, the deposited film is planarized by CMP so as to form an inter-level dielectric 30. Then, a contact hole passing through the inter-level dielectric 30 and reaching the high-concentration drain diffusion layer 17a located in the memory region Rmemo is formed, and thereafter the contact hole is filled in with tungsten or the like to form a bit-line contact 31. Also in the logic circuit region Rlogc, source and drain contacts are formed (not shown in FIG. 2A). Thereafter, an aluminum alloy film (or a copper alloy film) having a thickness of 400 nm is deposited on the inter-level dielectric 30, and then the deposit film is patterned to form a bit line 32. Thereby, the structure of the semiconductor device shown in FIGS. 1, 2A and 2B can be obtained.

According to the first method for fabricating a semiconductor device of this embodiment, the gate electrode 16a of the memory cell transistor, the plate electrode 16b of the planar capacitor and the gate electrodes 16c of the MIS transistors located in the logic circuit region Rlogc are formed of the common polysilicon film. Therefore, the simplified fabrication process allows reduction in production cost.

Second Method for Fabricating Semiconductor Device of First Embodiment

Figures 4A, 4B, 4C:
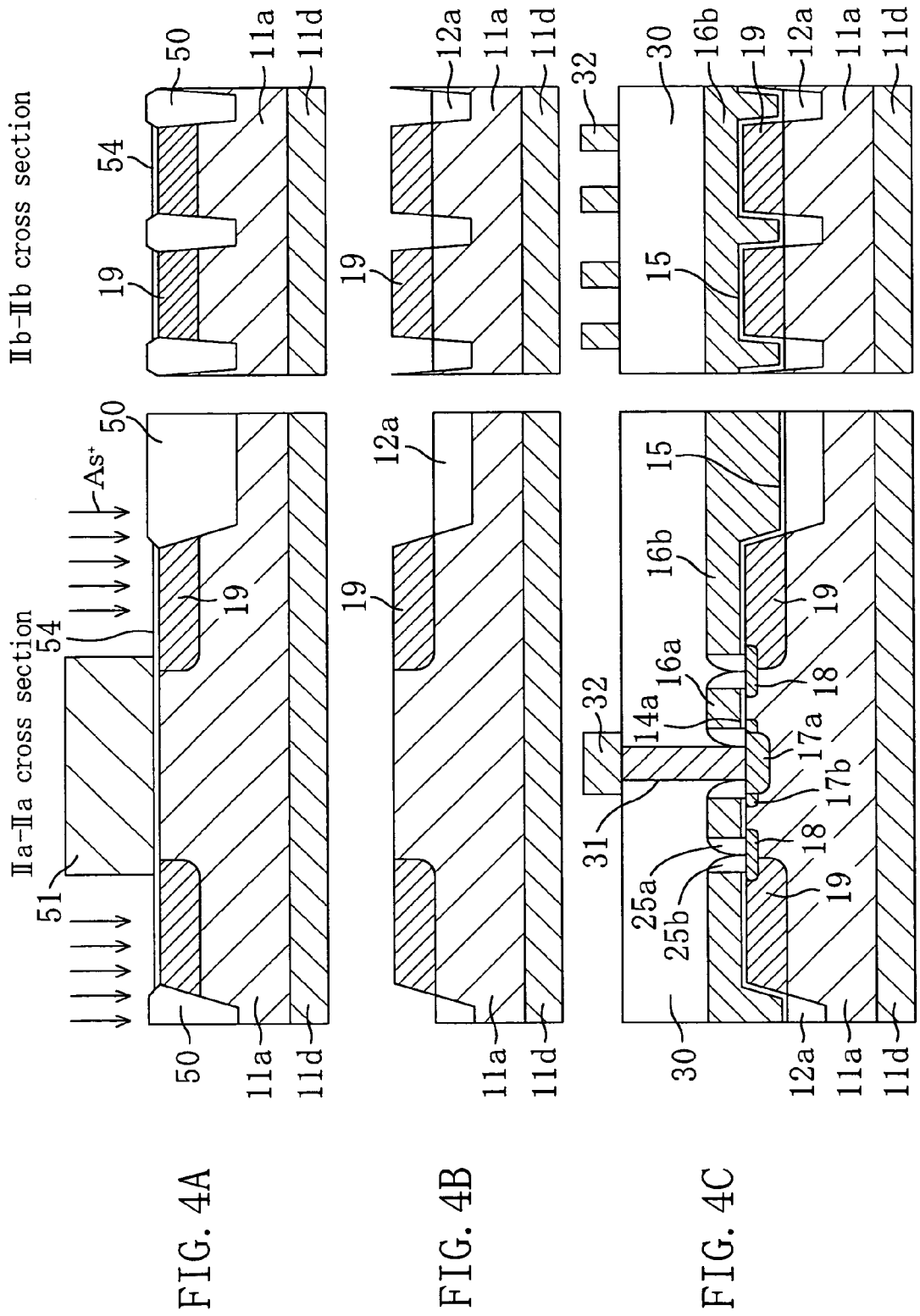
FIGS. 4A through 4C are cross sectional views illustrating a second method for fabricating a semiconductor device according to the first embodiment.

Next, a description will be given of a second method for fabricating a semiconductor device according to the first embodiment of the present invention. FIGS. 4A through 4C are cross sectional views illustrating the second method for fabricating a semiconductor device according to this embodiment. FIGS. 4A through 4C illustrate only the memory region Rmemo, and the logic circuit region Rlogc is not shown therein. Referring to FIG. 4A through 4C, a p-well 11a and a deep n-well 11d are formed in the silicon substrate 10. However, for convenience, a body of a silicon substrate 10 is not shown therein.

Initially, in a process step shown in FIG. 4A, the similar processes as in the process steps shown in FIG. 3A are carried out under the similar conditions as in the process step shown in FIG. 3A. More particularly, after an isolation trench for defining an active region is formed in the surface region of the silicon substrate 10, an isolation dielectric 50 (a shallow trench isolation 12b located in the logic circuit region Rlogc) is formed by filling the isolation trench with a silicon oxide film. Phosphorus ions (P$^+$) are implanted into the memory region Rmemo of the silicon substrate 10 by using a resist mask (not shown) covering the logic circuit region Rlogc, thereby forming a deep n-well lid (see FIG. 2A) in the bottom region of the p-well 11a located in the memory region Rmemo. The p-well 11a located in the memory region Rmemo, a p-well 11c and an n-well 11b both located in the logic circuit region Rlogc (see FIG. 2A), and channel stoppers and punch-through stoppers located in the memory region Rmemo and the logic circuit region Rlogc are formed.

Next, after an implantation protection oxide film 54 made of an oxide film is formed on each of the active regions of the memory region Rmemo and the logic circuit region Rlogc, a resist mask 51 is formed on the implantation protection oxide film 54 to cover the whole logic circuit region Rlogc and a part of the active region of the memory region Rmemo. Arsenic ions (As$^+$) are implanted by using this resist mask 51 as a mask, thereby forming an n-type diffusion layer 19 that becomes a storage node. At this time, the lateral size of the resist mask 51 is set such that a source diffusion layer 18 for a memory cell transistor and the n-type diffusion layer 19 for a planar capacitor Cpp overlap with each other.

Next, in a process step shown in FIG. 4B, the implantation protection oxide film 54 and the upper part of the isolation dielectric 50 located in the memory region Rmemo are removed by wet etching, thereby forming a shallow trench isolation 12a with the isolation trench and the lower part of the isolation dielectric 50 left. At this time, in the logic circuit region Rlogc, the isolation dielectric remains as the shallow trench isolation 12b (see FIG. 2A) as it is without being etched away.

Next, in a process step shown in FIG. 4C, similar processes as in FIG. 3C are carried out. More particularly, a capacitance dielectric 15 and a plate electrode 16b of the planar capacitor and a gate dielectric 14a and a gate electrode 16a of the memory cell transistor are formed. A gate dielectric 14b and a gate electrode 16c of each of the p-channel type MIS transistor and the n-channel type MIS transistor are formed in the logic circuit region Rlogc (see FIG. 2A). A low-concentration drain diffusion layer 17b, a high-concentration drain diffusion layer 17a, a source diffusion layer 18, and dielectric sidewalls 25a and 25b are formed in the memory region Rmemo, while source/drain diffusion layers 20 and 21 and dielectric sidewalls 26 of each of the MIS transistors are formed in the logic circuit region Rlogc. Thereafter, an inter-level dielectric 30, a bit-line contact 31 and a bit line 32 are formed.

According to the above-mentioned process steps, a semiconductor device having the structure shown in FIGS. 1, 2A and 2B can be obtained.

This second fabricating method is distinct from the first fabricating method in that after the n-type diffusion layer 19 is formed, the upper part of the isolation dielectric 50 is etched. Also according to the second fabricating method, the same effects can be achieved as in the first fabricating method.

Method for Fabricating Semiconductor Device of Modification of the First Embodiment Next, a description will be given of a method for fabricating a semiconductor device according to a modification of the first embodiment of the present invention. FIGS. 5A through 5C are cross sectional views illustrating process steps for fabricating a semiconductor device according to a modification of the first embodiment. FIGS. 5A through 5C also illustrate only the memory region Rmemo, and the logic circuit region Rlogc is not shown therein. Referring to FIGS. 5A through 5C, a p-well 11a and a deep n-well 11d are formed in the silicon substrate 10. However, for convenience, a body of the silicon substrate 10 is not shown therein.

Initially, in a process step shown in FIG. 5A, the similar processes as in the process steps shown in FIG. 3A are carried out under the similar conditions as in the process steps shown in FIG. 3A. More particularly, after an isolation trench for defining an active region is formed in the surface region of the silicon substrate 10, an isolation dielectric 50 (a shallow trench isolation 12b located in the logic circuit region Rlogc) is formed by filling the isolation trench with a silicon oxide film. Phosphorus ions (P$^+$) are implanted into the memory region Rmemo of the silicon substrate 10 by using a resist mask (not shown) covering the logic circuit region Rlogc, thereby forming a deep n-well 11d (see FIG. 2A) in the bottom region of the p-well 11a located in the memory region Rmemo. The p-well 11a located in the memory region Rmemo, a p-well 11c and an n-well 11b both located in the logic circuit region Rlogc (see FIG. 2A), and channel stoppers and punch-through stoppers located in the memory region Rmemo and the logic circuit region Rlogc are formed.

Next, in a process step shown in FIG. 5B, the upper part of the isolation dielectric 50 located only in the memory region Rmemo is selectively removed by wet etching using a resist mask 51 covering the whole logic circuit region Rlogc and a part of the active region located in the memory region Rmemo as a mask, thereby forming a shallow trench isolation 12a with the isolation trench and the lower part of the isolation dielectric 50 left. At this time, in the logic circuit region Rlogc, the isolation dielectric remains as the shallow trench isolation 12b (see FIG. 2A) as it is without being etched away. However, in this modification, implantation of arsenic ions (As$^+$) as shown in FIG. 3B is not carried out, resulting in no n-type diffusion layer 19 being formed.

More particularly, in this modification, the application of a bias to the plate electrode 16b allows an inversion layer located on the p-well surface to function as a storage node.

Next, in a process step shown in FIG. 5C, similar processes as in FIG. 3C are carried out. More particularly, a capacitance dielectric 15 and a plate electrode 16b of the planar capacitor and a gate dielectric 14a and a gate electrode 16a of the memory cell transistor are formed. A gate dielectric 14b and a gate electrode 16c of each of the p-channel type MIS transistor and the n-channel type MIS transistor are formed in the logic circuit region Rlogc (see FIG. 2A). A low-concentration drain diffusion layer 17b, a high-concentration drain diffusion layer 17a, a source diffusion layer 18, and dielectric sidewalls 25a and 25b are formed in the memory region Rmemo, while source/drain diffusion layers 20 and 21 and dielectric sidewalls 26 of each of the MIS transistors are formed in the logic circuit region Rlogc. Thereafter, an inter-level dielectric 30, a bit-line contact 31 and a bit line 32 are formed.

Also according to this modification, the same effects can be achieved as in the fabricating method of the first embodiment.

In the memory region Rmemo, the gate dielectric 14a and the capacitance dielectric 15 can be formed of different dielectrics, respectively. For example, the gate dielectric 14a may be formed of an oxide film, and the capacitance dielectric may be formed of an oxide film, an oxynitride film, an ON film obtained by successively stacking an oxide film and a nitride film, an ONO film obtained by successively stacking an oxide film, a nitride film and an oxide film, an $HfO_2$ film or a $ZrO_2$ film that are high-dielectric films, or the like. In the logic circuit region Rlogc, plural kinds of gate dielectrics of different thicknesses, such as two or three kinds, are often provided in accordance with types of transistors. The gate dielectric 14b of each of the transistors located in the logic circuit region Rlogc may also be formed of an oxide film, an oxynitride film, an ON film obtained by successively stacking an oxide film and a nitride film, an ONO film obtained by successively stacking an oxide film, a nitride film and an oxide film, an $HfO_2$ film or a $ZrO_2$ film that are high-dielectric films, or the like.

In the memory region Rmemo, the gate dielectric 14a and the capacitance dielectric 15 can be formed of a common dielectric. For example, the gate dielectric 14a and the capacitance dielectric can be composed of an oxide film, a oxynitride film, an ON film obtained by successively stacking an oxide film and a nitride film, an ONO film obtained by successively stacking an oxide film, a nitride film and an oxide film, an $HfO_2$ film or a $ZrO_2$ film that are high-dielectric films, or the like. In the logic circuit region Rlogc, plural kinds of the gate dielectrics of different thicknesses, such as two or three kinds, are often provided in accordance with types of transistors. The gate dielectric 14b of each of the transistors located in the logic circuit region Rlogc may also be formed of an oxide film, an oxynitride film, an ON film obtained by successively stacking an oxide film and a nitride film, an ONO film obtained by successively stacking an oxide film, a nitride film and an oxide film, an $HfO_2$ film or a $ZrO_2$ film that are high-dielectric films, or the like.

According to this embodiment, since the gate dielectric and the capacitance dielectric of the memory cell transistor are formed of different films, respectively, it becomes possible to form a capacitor having a small leakage current without degrading the performance of the transistor.

Second Embodiment

Figure 6:
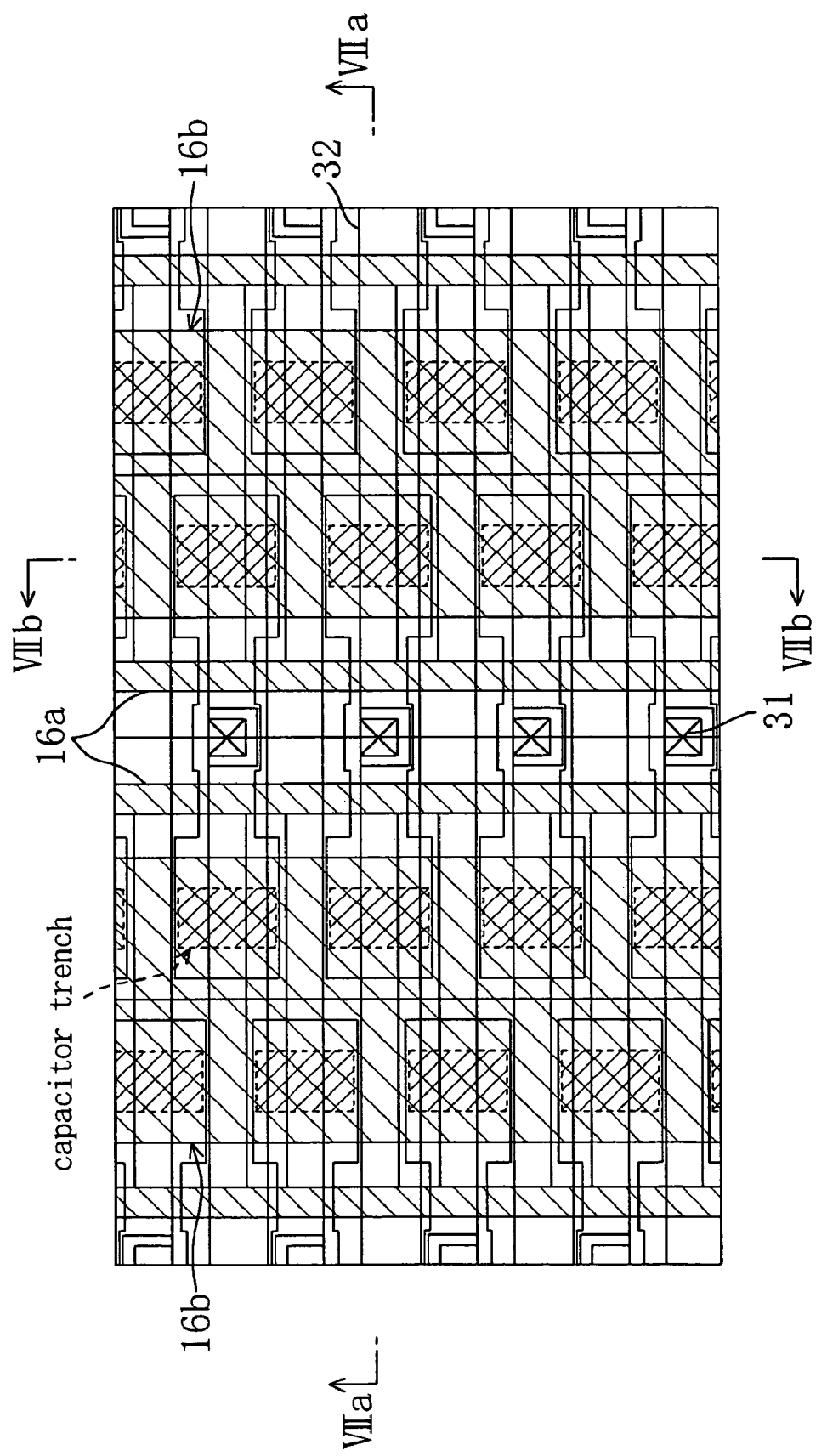
FIG. 6 is a plan view illustrating the structure of a memory of a semiconductor device according to a second embodiment of the present invention.
Figures 7A, 7B:
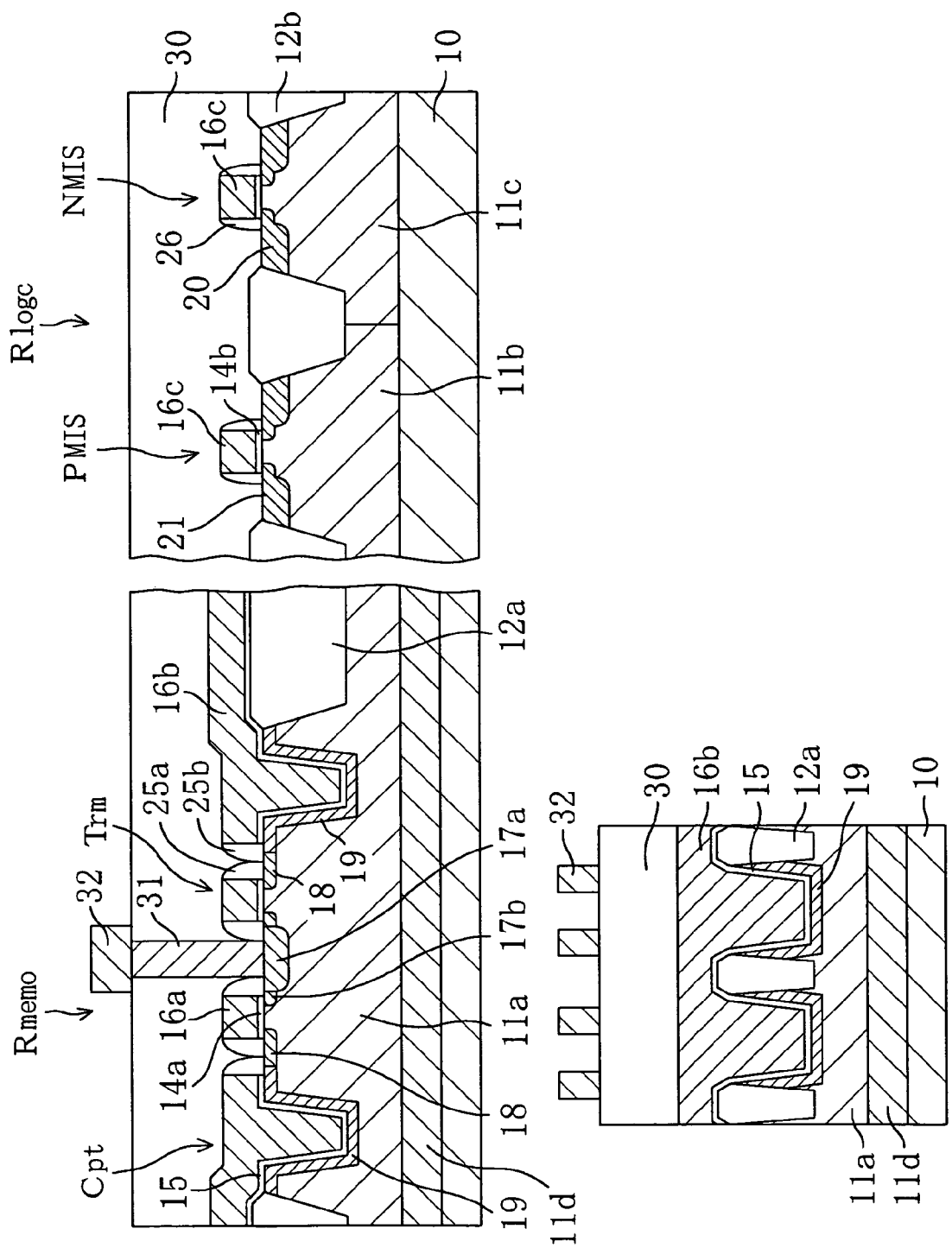
FIGS. 7A and 7B are cross sectional views taken along the lines VIIa—VIIa and VIIb—VIIb shown in FIG. 6, respectively.

FIG. 6 is a plan view illustrating the structure of a memory of a semiconductor device according to a second embodiment of the present invention. FIGS. 7A and 7B are cross sectional views taken along the lines VIIa—VIIa and VIIb—VIIb shown in FIG. 6, respectively. FIG. 7A illustrates cross sectional structures of the memory region Rmemo and the logic circuit region Rlogc of the semiconductor device. However, the cross sectional structure of the logic circuit region Rlogc is not shown in FIGS. 6 and 7B.

As shown in FIGS. 6, 7A and 7B, the semiconductor device of this embodiment includes a p-type silicon substrate 10, a p-well 11a provided in the memory region Rmemo of the silicon substrate 10, an n-well 11b and a p-well 11c both provided in the logic circuit region Rlogc of the silicon substrate 10, and a deep n-well 11d surrounding the bottom region of the p-well 11a located in the memory region Rmemo, i.e., the device has a so-called triple well structure. The device comprises a shallow trench isolation 12a defining an active region in the memory region Rmemo and a shallow trench isolation 12b defining an active region in the logic circuit region Rlogc.

In the memory region Rmemo, a memory cell transistor Trm including a gate electrode 16a, a gate dielectric 14a, a dielectric sidewall 25a, a low-concentration drain diffusion layer 17b containing n-type impurities with low concentration, a high-concentration drain diffusion layer 17a containing n-type impurities with high concentration, and a source diffusion layer 18 and a trench capacitor Cpt including a plate electrode 16b, an n-type diffusion layer 19 functioning as a storage node, a capacitance dielectric 15, and a dielectric sidewall 25b are arranged on the p-well 11a. Thus, a drain diffusion layer of the memory cell transistor is composed of the high-concentration drain diffusion layer 17a and the low-concentration drain diffusion layer 17b. On the other hand, the source diffusion layer 18 is composed of only a low-concentration impurity diffusion layer containing n-type impurities with low concentration as a whole.

In the logic circuit region Rlogc, there are provided a p-channel type MIS transistor (pMIS) including a gate electrode 16c, a gate dielectric 14b, a dielectric sidewall 26, and p-type source/drain diffusion layers 21 and an n-channel type MIS transistor (nMIS) including a gate electrode 16c, a gate dielectric 14b, a dielectric sidewall 26, and n-type source/drain diffusion layers 20.

An inter-level dielectric 30 is deposited on the whole substrate. There are provided a bit-line contact 31 passing through the inter-level dielectric 30 and connected to the high-concentration drain diffusion layer 17a of the memory cell transistor Trm located in the memory region Rmemo, and a bit line 32 connected to the bit-line contact 31 and extending on the inter-level dielectric 30.

Also in the logic circuit region Rlogc, there are provided a source and drain contacts passing through the inter-level dielectric 30 and reaching the source/drain diffusion layers 20 and 21, a gate contact passing through the inter-level dielectric 30 and coming into contact with the gate electrode 16c, and the like. However, since these members do not relate to the essence of the present invention, an illustration thereof is not given.

According to this embodiment, the plate electrode 16b is formed of a conductor film in common with the gate electrode 16a of the memory cell transistor as in the first embodiment while employing a structure of the trench capacitor. Therefore, it becomes possible to reduce the size of the memory cell and also reduce a step height on the whole substrate.

Here, it is preferable that the sum of the thickness of each of the gate electrodes 16a and 16c and the plate electrode 16b and the thickness of the capacitance dielectric 15 is larger than one-half of the width of the trench that is filled with the trench capacitor. In this case, no recess exists in the polysilicon film located above the trench so that photolithography in the fabricating process step is smoothly performed as will be described later. Therefore, the polysilicon film can be accurately patterned.

Method for Fabricating Semiconductor Device of Second Embodiment

Next, a description will be given of a method for fabricating a semiconductor device according to the second embodiment of the present invention. FIGS. 8A through 8C are cross sectional views illustrating process steps for fabricating a semiconductor device according to this embodiment. FIGS. 8A through 8C illustrate only the memory region Rmemo, and the logic circuit region Rlogc is not shown therein. Referring to FIGS. 8A through 8C, a p-well 11a and a deep n-well 11d are formed on the silicon substrate 10. However, for convenience, a body of the silicon substrate 10 is not shown therein.

Initially, in a process step shown in FIG. 8A, an isolation trench for defining an active region is formed in the surface region of the silicon substrate 10 by a known method using an underlying oxide film and a nitride film mask. At this time, also in the logic circuit region Rlogc, the isolation trench is formed. Thereafter, the isolation trench is filled with the silicon oxide film so as to form a shallow trench isolation 12a. At this time, also in the logic circuit region Rlogc, a trench isolation 12b as shown in FIG. 7A is formed. Phosphorus ions ($P^+$) are implanted into the memory region Rmemo of the silicon substrate 10 by using a resist mask (not shown) covering the logic circuit region Rlogc, thereby forming the deep n-well 11d (see FIG. 2A) in the bottom region of the p-well 11a located in the memory region Rmemo. Boron ions ($B^+$) are implanted into the memory region Rmemo and a part of the logic circuit region Rlogc of the silicon substrate 10 by using a resist mask (not shown) covering a p-channel type transistor formation region located in the logic circuit region Rlogc, thereby forming the p-well 11a in the memory region Rmemo and the p-well 11c in the logic circuit region Rlogc (see FIG. 7A). Phosphorus ions ($P^+$) are implanted by using a resist mask (not shown) covering the memory region Rmemo and the n-channel type transistor formation region located in the logic circuit region Rlogc, thereby forming the n-well 11b (see FIG. 7A) in the logic circuit region Rlogc. Conditions of these process steps are similar to those of the first embodiment. In the memory region Rmemo and the logic circuit region Rlogc, impurities for channel stoppers are implanted immediately below the shallow trench isolations 12a and 12b, and impurities for punch-through stoppers are implanted below channel regions of the transistors, although they are not shown in FIG. 7A.

Thereafter, a resist mask 55 having a region of the substrate that is to form a capacitor trench opened is formed on the silicon substrate 10. Dry etching is performed using the resist mask 55, thereby forming a capacitor trench 56 in the silicon substrate 10. The width of the capacitor trench is 0.3 $\mu$m. At this time, in the logic circuit region, no capacitor trench is formed.

Next, in a process step shown in FIG. 8B, after the resist mask 55 is removed, a resist mask 55' is formed to cover the logic circuit region Rlogc and a part of the active region located in the memory region Rmemo, and thereafter arsenic ions ($As^+$) are implanted by using this resist mask 55' as an implantation mask, thereby forming an n-type diffusion layer 19 that becomes a storage node in a region of the memory region Rmemo located in the inner wall surface of the capacitor trench 56 and its surrounding region.

Next, in a process step shown in FIG. 8C, an oxide film having a thickness of 2 through 6 nm, which serves as a capacitance dielectric 15 and a gate dielectric 14a both located in the memory region Rmemo and a gate dielectric 14b located in the logic circuit region Rlogc, is formed, and thereafter a polysilicon film having a thickness of 200 nm is deposited thereon. The total thickness of this polysilicon film and the oxide film is one-half or more of the width of the capacitor trench 56. Thereafter, the capacitance dielectric 15 and a plate electrode 16b for a trench capacitor and the gate dielectric 14a and a gate electrode 16a for a memory cell transistor are formed in the memory region Rmemo by patterning the polysilicon film and the thermal oxide film. The gate dielectric 14b and a gate electrode 16c of each of the p-channel type MIS transistor and the n-channel type transistor are formed in the logic circuit region Rlogc (see FIG. 7A), although they are not shown in FIG. 8C.

Thereafter, arsenic ions with a concentration for extension are implanted into a memory cell transistor region located in the memory region Rmemo and an n-channel type MIS transistor region located in the logic circuit region Rlogc by using the gate electrodes 16a and 16c and the plate electrode 16b as masks. Thereby, a low-concentration drain diffusion layer 17b and source diffusion layer 18 are formed in the memory region Rmemo, and an extension diffusion layer of the n-channel type MIS transistor is formed in the logic circuit region Rlogc. At this time, the source diffusion layer 18 of the memory cell transistor is formed so as to overlap with an n-type diffusion layer 19 that is the storage node. In the logic circuit region Rlogc, boron fluoride ions with a concentration for extension of a p-channel type MIS transistor are implanted to form an extension diffusion layer of the p-channel type MIS transistor, although not shown in the figures.

Next, a dielectric sidewall 25a is formed along the sides of the gate electrode 16a of the memory cell transistor. At this time, a dielectric sidewall 25b is formed also along the sides of the plate electrode 16b of the trench capacitor. The source diffusion layer 18 of the memory cell transistor is covered with the two dielectric sidewalls 25a and 25b. A dielectric sidewall 26 is formed also along the sides of the gate electrode 16c of each of the p-channel type MIS transistor and the n-channel type MIS transistor in the logic circuit region Rlogc (see FIG. 7A).

Thereafter, high-concentration arsenic ions ($As^+$) are implanted into the n-channel type MIS transistor located in the logic circuit region Rlogc and the memory region Rmemo by using the gate electrodes 16a and 16c, the plate electrode 16b, and the dielectric sidewalls 25a and 25b as masks. Thereby, source/drain diffusion layers 20 of the n-channel type MIS transistor are formed in the logic circuit region Rlogc. A high-concentration drain diffusion layer 17a is also formed in the memory region Rmemo.

At this time, since the top of the source diffusion layer 18 is covered with the dielectric sidewalls 25a and 25b, high-concentration arsenic is not implanted in this layer, resulting in no high-concentration source diffusion layer being formed. High concentration boron fluoride ions are implanted into the p-channel type MIS transistor located in the logic circuit region Rlogc by using the gate electrode 16c and the dielectric sidewall 26 as masks, thereby forming source/drain diffusion layers 21 of the p-channel type MIS transistor.

Although later process steps are not shown, processes similar to those of the first embodiment are carried out. Thereby, an inter-level dielectric 30, bit-line contacts 31 passing through the inter-level dielectric 30 and respectively connected to the high concentration drain diffusion layer 17a and the plate electrode 16b, and a bit line 32 extending on the top of the inter-level dielectric 30 are formed on the substrate. Also in the logic circuit region Rlogc, source and drain contacts are formed (not shown in FIG. 7A). Thereby, the structure of the semiconductor device shown in FIGS. 6, 7A and 7B can be obtained.

According to the fabricating method of this embodiment, after the capacitor trench 56 is formed, a polysilicon film having a thickness of one-half or more of the width of the capacitor trench is deposited on the capacitor trench 56. Therefore, the top surface of the polysilicon film located above the capacitor trench 56 is planarized. When the resist mask is formed to pattern the polysilicon film, a steep recess located on the top surface of the polysilicon film would allow the resist to be absorbed by the recess so that the flatness of the whole resist film might be deteriorated. In such a case, it would become difficult to ensure a given patterning accuracy of the gate electrode in a process for a device having a design rule of approximately 0.1 µm. In contrast, in this embodiment, the thickness of the polysilicon film is set as one-half or more of the width of the capacitor trench 56. Therefore, the patterning accuracy of the gate electrode can be maintained, and it becomes substantially possible that the gate electrodes of the memory cell transistor and the logic transistor and the plate electrode of the trench capacitor are formed of a common conductor film (polysilicon film).

Since the gate electrodes of the memory cell transistor and the logic transistor and the plate electrode of the trench capacitor are formed of the common conductor film (polysilicon film), the step height on the whole substrate can be kept small and the formation of an interconnect having a fine pattern can be facilitated. Therefore, a merged DRAM/logic semiconductor device can become denser.

In the memory region Rmemo, the gate dielectric 14a and the capacitance dielectric 15 can be formed of different dielectrics, respectively. For example, the gate dielectric 14a can be formed of an oxide film, and the capacitance dielectric 15 can be formed of an oxide film, an oxynitride film, an ON film obtained by successively stacking an oxide film and a nitride film, an ONO film obtained by successively stacking an oxide film, a nitride film and an oxide film, an $HfO_2$ film or a $ZrO_2$ film that are high-dielectric films, or the like. In the logic circuit region Rlogc, plural kinds of gate dielectrics of different thicknesses, such as two or three kinds, are often provided in accordance with types of transistors. The gate dielectric 14b of each of the transistors located in the logic circuit region Rlogc may also be formed of an oxide film, an oxynitride film, an ON film obtained by successively stacking an oxide film and a nitride film, an ONO film obtained by successively stacking an oxide film, a nitride film and an oxide film, an $HfO_2$ film or a $ZrO_2$ film that are high-dielectric films, or the like.

Since the gate dielectric and the capacitance dielectric of the memory cell transistor are formed of different films, respectively, it becomes possible to form a capacitor having a small leakage current without degrading the performance of the transistor.

Furthermore, when a hard mask is employed for the processing of the gate electrode and an antireflection coating is formed, the opening width of the shallow trench is designed so as to planarize the shallow trench part including the dielectric formed on these electrode materials, thereby keeping the patterning accuracy of the gate electrode high.

Modification of Method for Fabricating Semiconductor Device of Second Embodiment Next, a description will be given of a modification of a method for fabricating a semiconductor device according to the second embodiment of the present invention. FIGS. 9A through 9C are cross sectional views illustrating a modification of a method for fabricating a semiconductor device according to this embodiment. FIGS. 9A through 9C illustrate only the memory region Rmemo, and the logic circuit region Rlogc is not shown therein. Referring to FIGS. 9A through 9C, a p-well 11a and a deep n-well 11d are formed in the silicon substrate 10. However, for convenience, a body of the silicon substrate 10 is not shown therein.

Initially, in a process step shown in FIG. 9A, an oxide film mask (not shown) consisting of, for example, an $SiO_2$ film having a thickness of 200 nm is formed on the p-type silicon substrate 10, and a capacitor trench is formed in the silicon substrate 10 by dry etching using the oxide film mask.

Next, arsenic ions ($As^+$) are implanted using an implantation mask (not shown), thereby forming an n-type diffusion layer 19 that becomes a storage node.

Next, after the implantation mask is removed, a silicon oxide film having a thickness of 20 nm and a silicon nitride film having a thickness of 95 nm are successively formed on the substrate, and a part of the silicon nitride film 60 located above the trench is planarized.

A nitride film mask 60 and an underlying oxide film 59 are formed by patterning the silicon nitride film and the silicon oxide film. A shallow trench 61 is formed in the silicon substrate 10 by dry etching using the nitride film mask 60 or the like as a mask. At this time, a shallow trench is formed also in the logic circuit region, although this is not shown.

Next, in a process step shown in FIG. 9B, after a silicon oxide film (not shown) is deposited on the substrate, the silicon oxide film is planarized by CMP. Thereafter, the nitride film mask 60 and the underlying oxide film 59 are removed, thereby forming a shallow trench isolation 12a. At this time, the surface of the shallow trench isolation 12a is etched. However, this is only etched by a slight thickness relative to the whole thickness. Thereafter, the deep n-well 11d, the p-well 11a, the p-well 11c, the n-well 11b (see FIG. 2A) and the like are formed as in the second embodiment. In the memory region Rmemo and the logic circuit region Rlogc, impurities for channel stoppers are implanted immediately below the shallow trench isolations 12a and 12b, and impurities for punch-through stoppers are implanted below channel regions of the transistors, although they are not shown in FIG. 2A.

Thereafter, in a process step shown in FIG. 9C, the structure of the semiconductor device shown in FIGS. 6, 7A and 7B can be obtained by performing processes as in the process steps shown in FIG. 8C, which were already described.

This embodiment is different from the method shown in FIGS. 8A through 8C in which the shallow trench isolation is initially formed and then the capacitor trench is formed, in that the capacitor trench and the n-type diffusion layer 19 are initially formed and then the shallow trench isolations 12a and 12b are formed. Also in this procedure, the effects basically similar to those of the fabricating method shown in FIGS. 8A through 8C can be achieved.

In addition, according to the procedure of this modification, oxidation in the process steps shown in FIGS. 9A and 9B enables the corner shape of the capacitor trench to be easily rounded, and also enables the trench wall to be cleaned and smoothed. Therefore, the capacitance dielectric 15 to be formed has improved properties. For example, such an improved property means that the film thickness is substantially made uniform so that a leakage through the capacitance dielectric 15 is reduced and variations in capacitance values become small, resulting in a stabilized charge storage function.

Third Embodiment

The planar capacitor according to the first embodiment can be arranged so as to fill in the upper parts of the capacitor trench and the trench of the shallow trench isolation that are described in the second embodiment.

Figure 10:
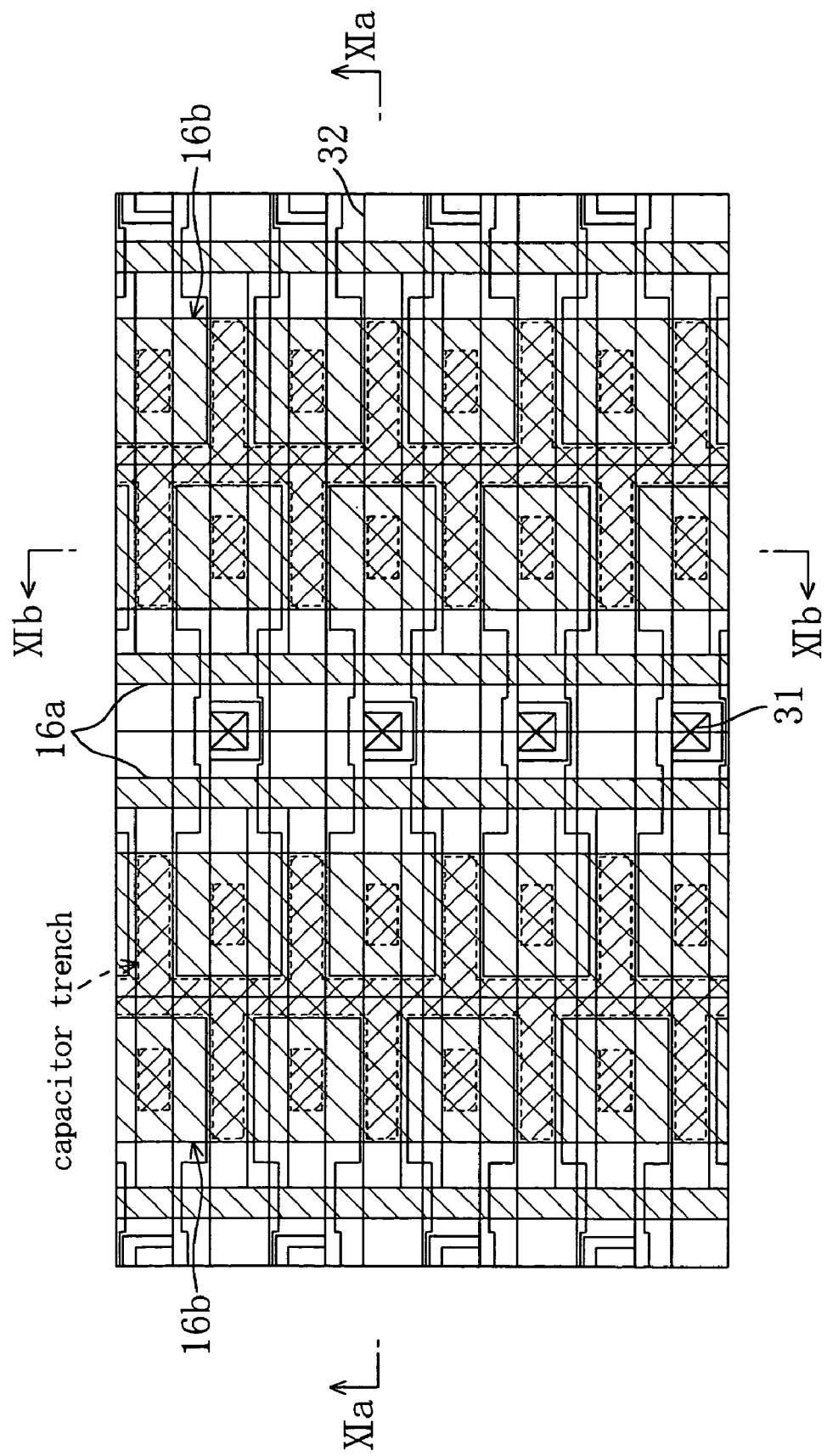
FIG. 10 is a plan view illustrating the structure of a memory of a semiconductor device according to a third embodiment of the present invention.
Figures 11A, 11B:
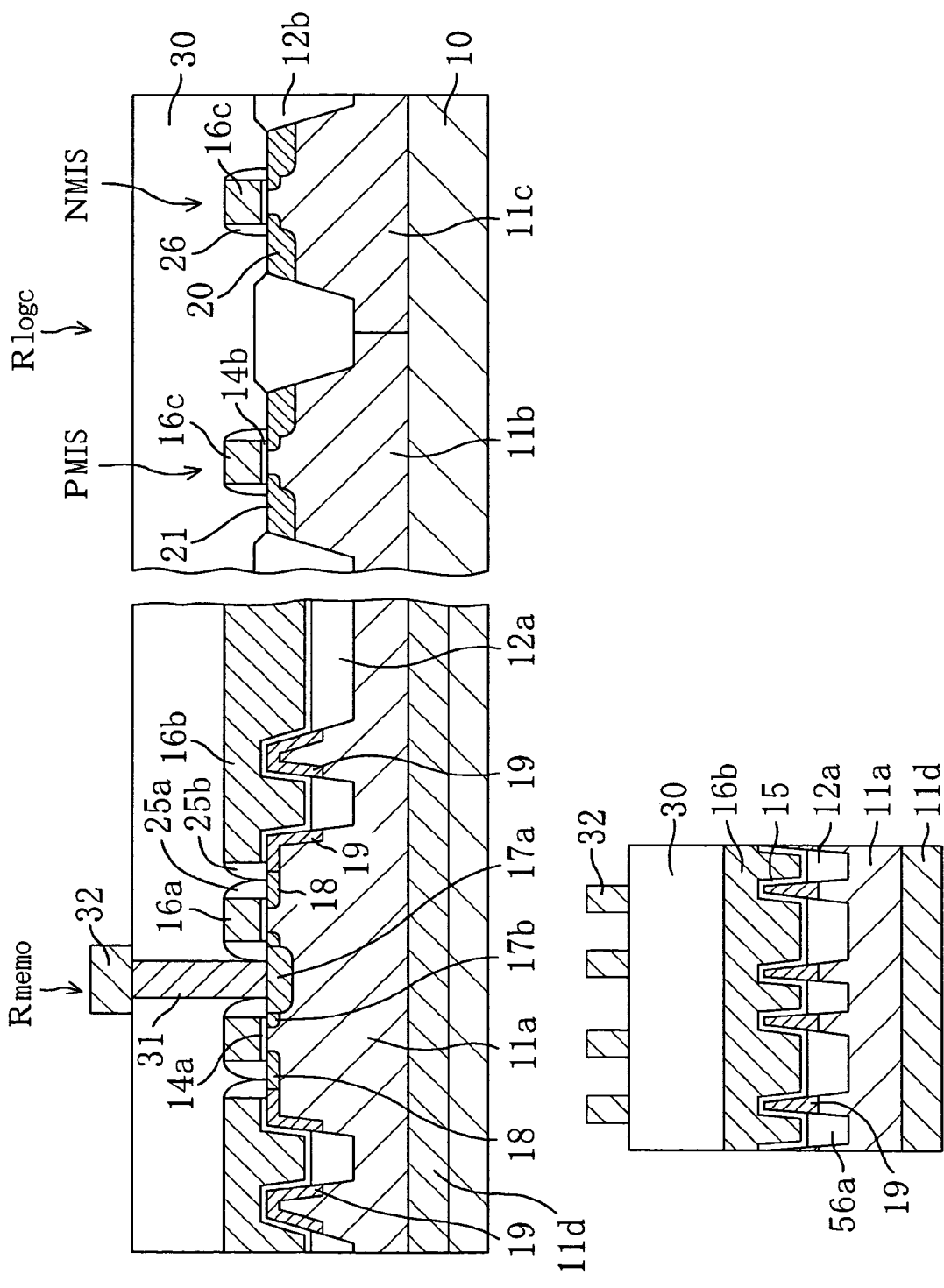
FIGS. 11A and 11B are cross sectional views taken along the lines XIa—XIa and XIb—XIb shown in FIG. 10, respectively.

FIG. 10 is a plan view illustrating the structure of a memory of a semiconductor device according to a third embodiment of the present invention. FIGS. 11A and 11B are cross sectional views taken along the lines XIa—XIa and XIb—XIb shown in FIG. 10, respectively. Although FIG. 11A illustrates cross sectional structures of a memory region Rmemo and a logic circuit region Rlogc of the semiconductor device, FIGS. 10 and 11B do not illustrate the cross sectional structure of the logic circuit region Rlogc.

As shown in FIGS. 10, 11A and 11B, the semiconductor device of this embodiment includes a p-type silicon substrate 10, a p-well 11a provided in the memory region Rmemo of the silicon substrate 10, an n-well 11b and a p-well 11c both provided in the logic circuit region Rlogc of the silicon substrate 10, and a deep n-well 11d surrounding the bottom area of the p-well 11a located in the memory region Rmemo, i.e., the device has a so-called triple-well structure. The device comprises a shallow trench isolation 12a defining an active region in the memory region Rmemo and a shallow trench isolation 12b defining an active region in the logic circuit region Rlogc.

In the memory region Rmemo, a memory cell transistor Trm including a gate electrode 16a, a gate dielectric 14a, a dielectric sidewall 25a, a low-concentration drain diffusion layer 17b containing n-type impurities with low concentration, a high-concentration drain diffusion layer 17a containing n-type impurities with high concentration, and a source diffusion layer 18 and a planar capacitor Cpp including a plate electrode 16b, an n-type diffusion layer 19 functioning as a storage node, a capacitance dielectric 15, and a dielectric sidewall 25b are arranged on the p-well 11a. Thus, a drain diffusion layer of the memory cell transistor is composed of the high-concentration drain diffusion layer 17a and the low-concentration drain diffusion layer 17b. On the other hand, the source diffusion layer 18 is composed of only a low-concentration impurity diffusion layer containing n-type impurities with low concentration as a whole.

The capacitance dielectric 15 and the plate electrode 16b of the planar capacitor Cpp are arranged on the silicon substrate 10 and to the inside of the trench shared with the shallow trench isolation 12a and the capacitor trench of the second embodiment (trench denoted by numeral 56 in FIG. 8A) so that the upper parts of the trenches are filled with the capacitance dielectric 15 and the plate electrode 16b. The lower part of the capacitor trench is formed of a buried oxide layer 56a. The n-type diffusion layer 19 are formed, with end regions thereof extending along the sides of the upper parts of the trenches, so as to reach regions of the substrate overlapping with the shallow trench isolation 12a and the buried oxide layer 56a.

In the logic circuit region Rlogc, there are provided a p-channel type MIS transistor (pMIS) including a gate electrode 16c, a gate dielectric 14b, a dielectric sidewall 26, and p-type source/drain diffusion layers 21 and an n-channel type MIS transistor (nMIS) including a gate electrode 16c, a gate dielectric 14b, a dielectric sidewall 26, and n-type source/drain diffusion layers 20.

An inter-level dielectric 30 is deposited on the whole substrate. There are provided a bit-line contact 31b passing through the inter-level dielectric 30 and connected to the high-concentration drain diffusion layer 17a of the memory cell transistor Trm located in the memory region Rmemo, and a bit line 32 connected to the bit-line contact 31 and extending on the inter-level dielectric 30.

Also in the logic circuit region Rlogc, there are provided source and drain contacts passing through the inter-level dielectric 30 and reaching the source/drain diffusion layers 20 and 21, a gate contact passing through the inter-level dielectric 30 and coming into contact with the gate electrode 16c, and the like. However, since these members do not relate to the essence of the present invention, an illustration thereof is not given.

This embodiment is characterized in that the plate electrode 16b is formed of a conductor film (in this embodiment, a polysilicon film) in common with the gate electrode 16a of the memory cell transistor Trm, and that the capacitance dielectric 15 and the plate electrode 16b of the capacitor Cpp are provided to the insides of the capacitor trench 56 of the second embodiment (see FIG. 8A) as well as the trench shared with the shallow trench isolation 12a so as to fill in the upper parts of the trenches.

The capacitor of this embodiment is provided over the top surface of the silicon substrate 10 and part of the sides of the trench as in the first embodiment and has a structure having an increased capacitance as a so-called merged planar/trench capacitor. Thereby, reduction in the area of the substrate required for a memory function can be achieved.

In addition, in this embodiment, the area of a part of the planar capacitor functioning as a capacitance is increased more than in the first embodiment. Therefore, the effects of the first embodiment can be achieved more noticeably.

This embodiment is basically identical in process steps to the method shown in FIGS. 3A through 3C, and is different only in that the number of trenches to be formed (trench isolation dielectrics 50) is increased. Therefore, an illustration and description thereof are not given. The method shown in FIGS. 4A through 4C—second fabricating method) and the structure shown in FIGS. 5A through 5C (modification) and a method for fabricating the same can also be applied to this embodiment.

Fourth Embodiment

Figure 12A:
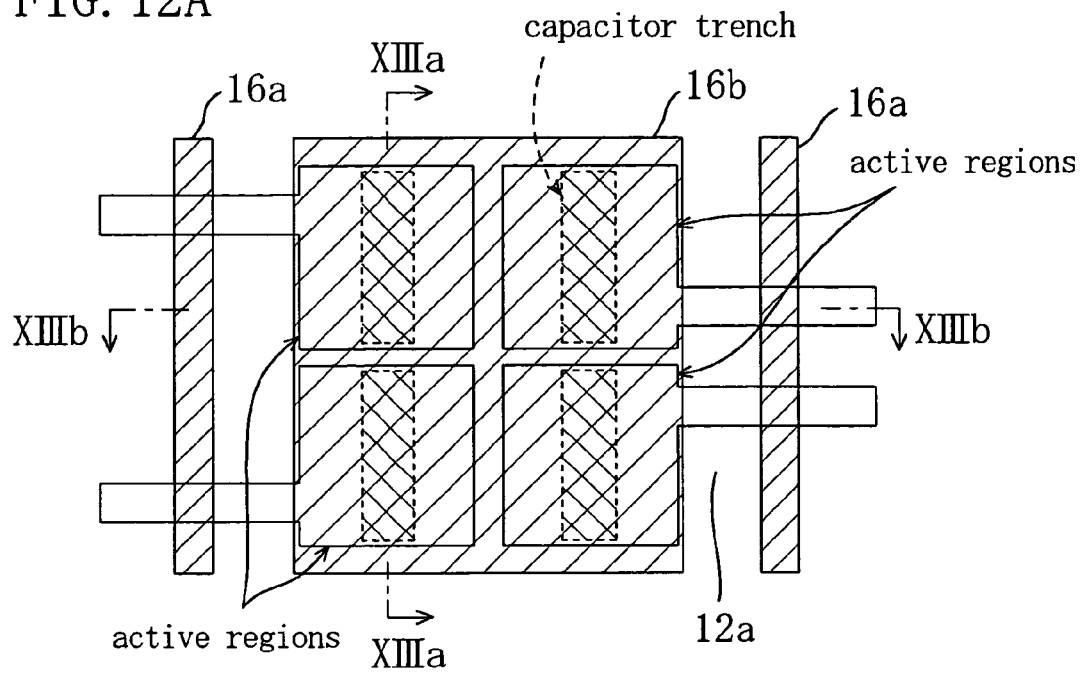
FIGS. 12A and 12B are a plan view illustrating the structure of a memory of a semiconductor device according to a fourth embodiment of the present invention with members above a gate electrode and a plate electrode being omitted, and a plan view illustrating the structure of a resist mask used at the formation of a capacitor trench, respectively.
Figure 12B:
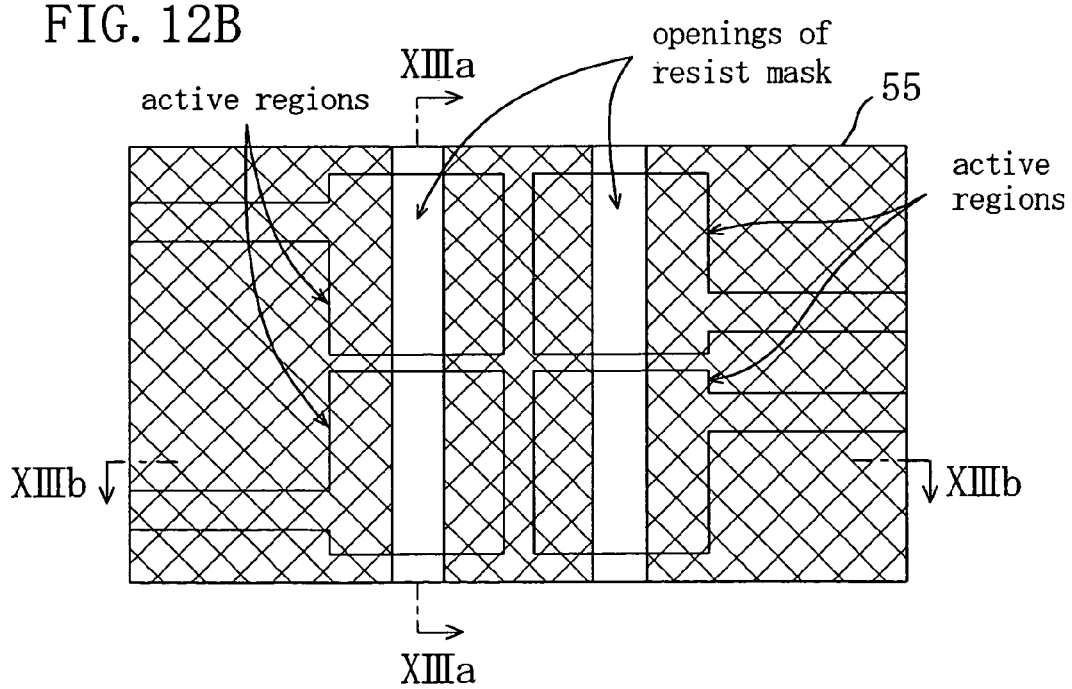

FIGS. 12A and 12B are a plan view illustrating the structure of a memory of a semiconductor device according to a fourth embodiment of the present invention with members above a gate electrode and a plate electrode being omitted, and a plan view illustrating the structure of a resist mask used at the formation of a capacitor trench, respectively. FIGS. 13A through 13D are cross sectional views taken along the lines XIIIa—XIIIa and XIIIb—XIIIb shown in FIGS. 12. Referring to FIGS. 13A through 13D, the cross sectional structure of the logic circuit region Rlogc of the semiconductor device is not shown.

As shown in FIG. 12A, a gate electrode 16a and a plate electrode 16b are provided over active regions (substrate regions) and a shallow trench isolation 12a surrounding the active regions. The plate electrode 16b is partially filled in a capacitor trench as in the second embodiment. The capacitor trench extends substantially parallel to a gate width direction and is located approximately in the middle of the rectangular substrate region surrounded by the shallow trench isolation 12a in a gate length direction. The other structures of the semiconductor device are the same as those of the second embodiment.

Hereinafter, in this embodiment, a description will be given mainly of a method for forming the capacitor trench and the plate electrode as characteristic parts of this embodiment.

Figure 13A:
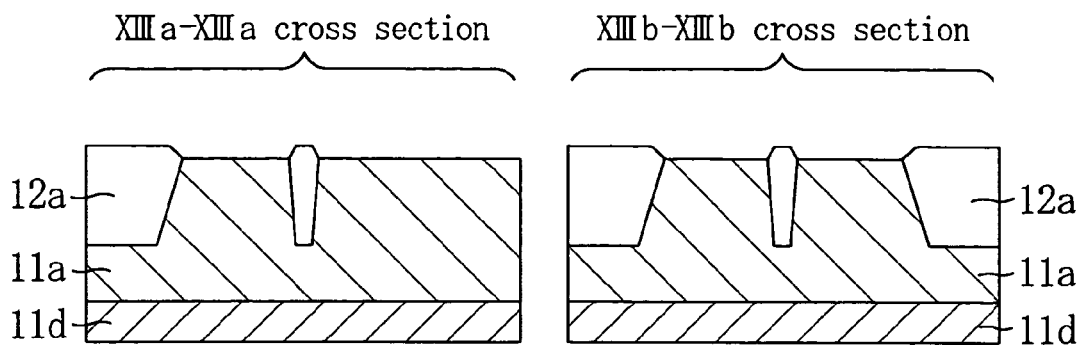
FIGS. 13A through 13D are cross sectional views taken along the lines XIIIa—XIIIa and XIIIb—XIIIb shown in FIGS. 12.

Initially, in a process step shown in FIG. 13A, the shallow trench isolation 12a is formed by forming an isolation trench and filling the isolation trench with a silicon oxide film. At this time, a trench isolation is formed also in the logic circuit region Rlogc. A deep n-well 11d, a p-well 11a, and a p-well 11c and an n-well 11b both located in the logic circuit region are formed by carrying out the process steps similar to those of the second embodiment (see FIG. 7A). Referring to FIGS. 13A through 13D, the p-well 11a and the deep n-well 11d are formed in the silicon substrate 10. However, for convenience, a body of the silicon substrate 10 is not shown therein.

Figure 13B:
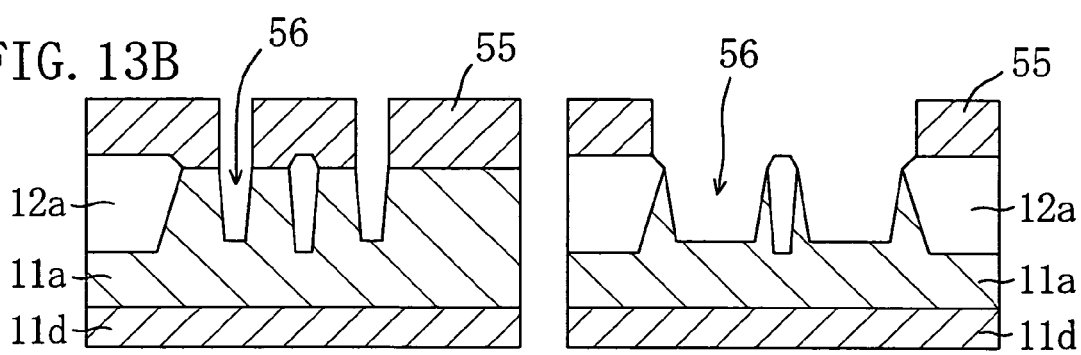

Next, in a process step shown in FIG. 13B, a resist mask 55 having a region that is to form the capacitor trench opened (see FIG. 12B) is formed on the silicon substrate 10. As shown in FIGS. 12B and 13B, an opening of the resist mask 55 lies across part of the shallow trench isolation 12a and plural active regions (substrate regions). Dry etching is performed using the resist mask 55, thereby forming a capacitor trench 56 in the silicon substrate 10. At this time, a high etching selection ratio of a silicon oxide film constructing the shallow trench isolation 12a to a silicon substrate need be ensured. Therefore, a chlorine gas (for example, HBr/Cl$_2$) is employed as an etching gas. The width of the capacitor trench 56 is 0.3 μm, for example. At this time, no capacitor trench is formed in the logic circuit region.

Figure 13C:
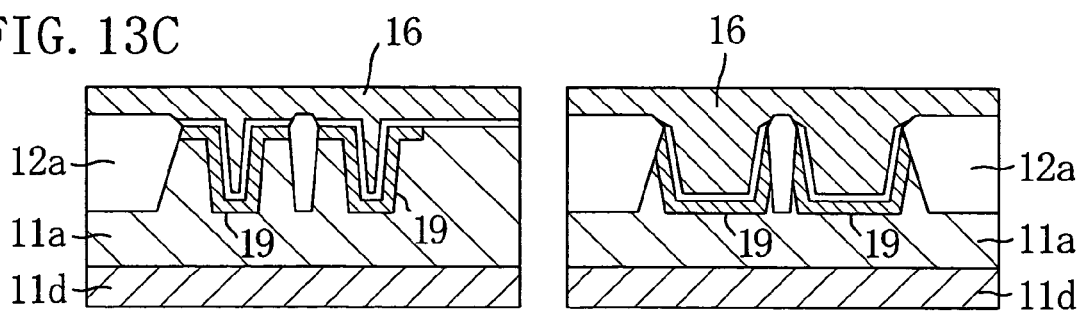

Next, in a process step shown in FIG. 13C, after the resist mask 55 is removed, a resist mask (not shown) is formed to cover a range of the substrate smaller than the transistor formation region. Thereafter, arsenic ions (As$^+$) are implanted using this resist mask as an implantation mask, thereby forming an n-type diffusion layer 19 that becomes a storage node in a region of the substrate located immediately below the wall surface of the capacitor trench 56 and its surrounding region.

Next, a thermal oxide film having a thickness of 2.9 nm, which serves as a capacitance dielectric 15 located in the memory region Rmemo and a gate dielectric 14a located in the memory region Rmemo, and a thermal oxide film having a thickness of 2 through 6 nm, which serves as a gate dielectric 14b located in the logic circuit region Rlogc (see FIG. 7A), are formed, and thereafter a polysilicon film 16 having a thickness of 200 nm is deposited thereon. The total thickness of this polysilicon film 16 and the thermal oxide film is one-half or more of the width of the capacitor trench 56.

Figure 13D:
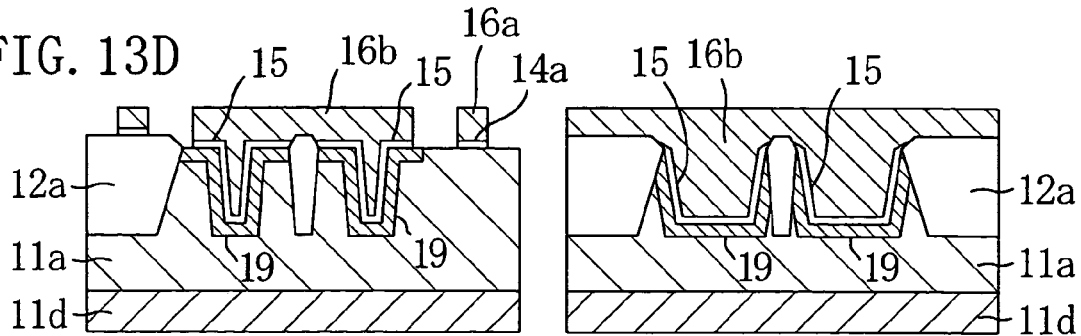

Next, in a process step shown in FIG. 13D, the capacitance dielectric 15 and a plate electrode 16b for a trench capacitor and the gate dielectric 14a and a gate electrode 16a for a memory cell transistor are formed in the memory region Rmemo by patterning the polysilicon film 16 and the thermal oxide film. In the logic circuit region Rlogc, the gate dielectric 14b and a gate electrode 16c of each of a p-channel type MIS transistor and an n-channel type MIS transistor are formed (see FIG. 7A), although they are not shown in FIG. 13D.

Although later process steps are not shown, process steps as in the fabricating method of the second embodiment are carried out. Thereby, sidewalls 25a and 25b, a high-concentration drain diffusion layer 17a, a low-concentration drain diffusion layer 17b, and a source diffusion layer 18 are formed in the memory region Rmemo, and a sidewall 26, and source/drain diffusion layers 20 and 21 are formed in the logic circuit region Rlogc.

According to the method of this embodiment, in the process step shown in FIG. 13B, etching is performed using the resist mask 55 having an opening lying over the plural active regions between which the shallow trench isolation 12a is sandwiched, so as to form the capacitor trench 56. Therefore, a specific positioning accuracy of the resist mask for the shallow trench isolation is not necessarily required, resulting in simplifying the process step.

Fifth Embodiment

Figure 14A:
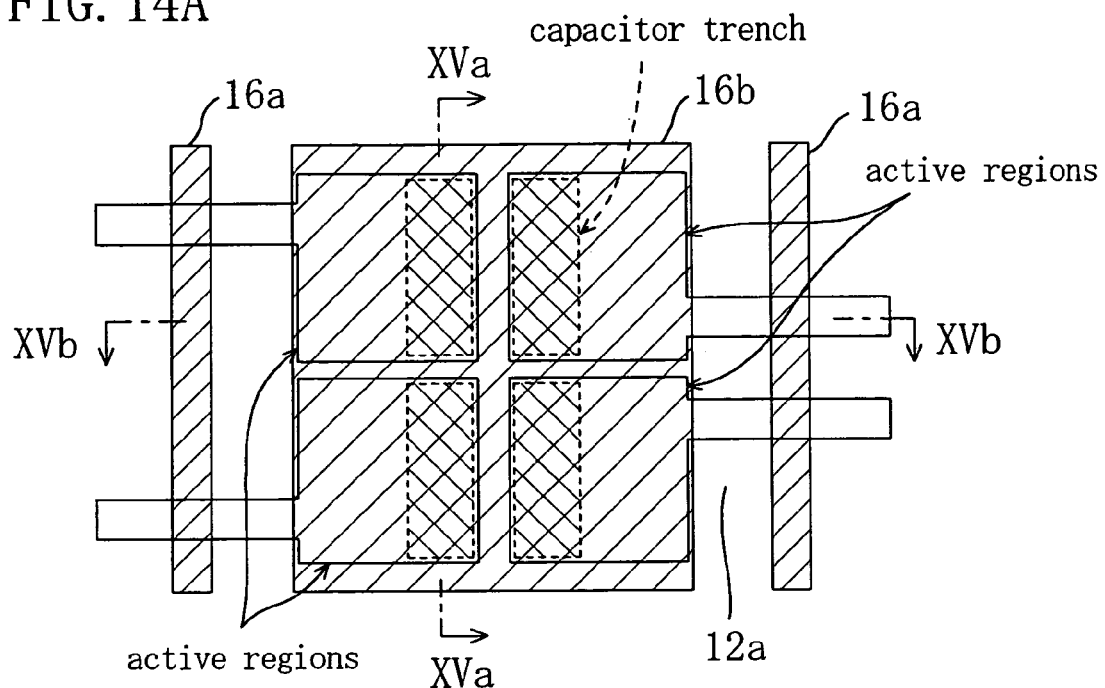
FIGS. 14A and 14B are a plan view illustrating the structure of a memory of a semiconductor device according to a fifth embodiment of the present invention with members above a gate electrode and a plate electrode being omitted, and a plan view illustrating the structure of a resist mask used at formation of a capacitor trench, respectively.
Figure 14B:
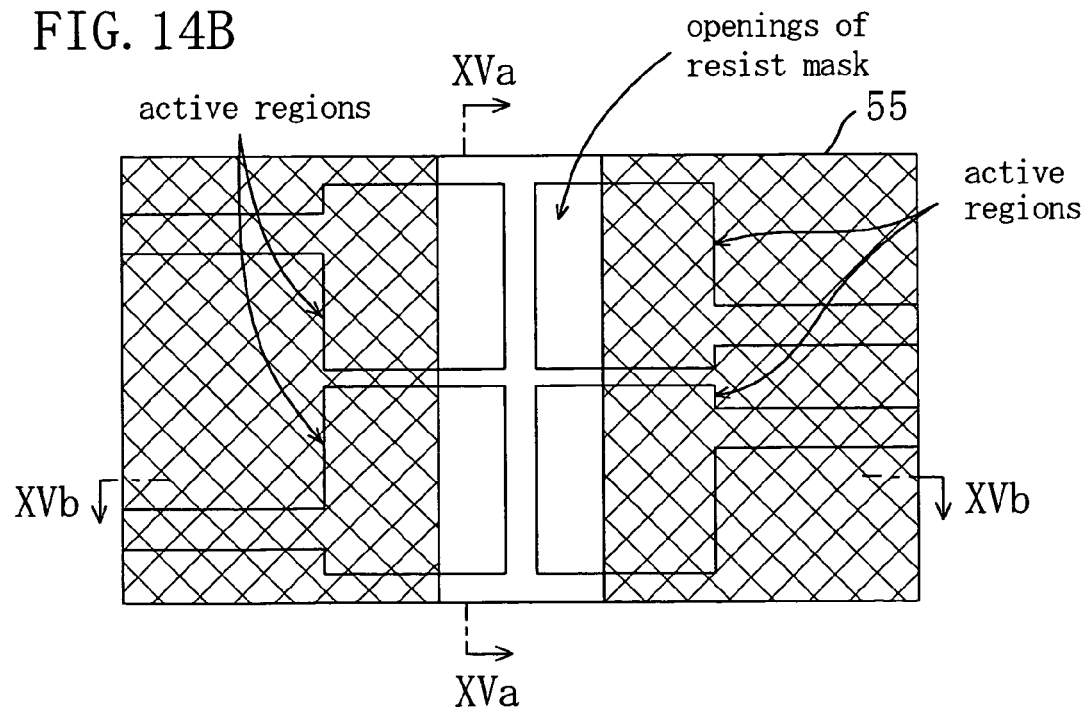

FIGS. 14A and 14B are a plan view illustrating the structure of a memory of a semiconductor device according to a fifth embodiment of the present invention with members above a gate electrode and a plate electrode being omitted and a plan view illustrating the structure of a resist mask used at the formation of a capacitor trench, respectively. FIGS. 15A through 15D are cross sectional views taken along the lines XVa—XVa and XVb—XVb shown in FIGS. 14. Referring to FIGS. 15A through 15D, the cross sectional structure of a logic circuit region Rlogc of the semiconductor device is not shown.

As shown in FIG. 14A, a gate electrode 16a and a plate electrode 16b are provided over active regions (substrate regions) and a shallow trench isolation 12a surrounding the active regions. The plate electrode 16b is partially filled in a capacitor trench as in the second embodiment. The capacitor trench extends substantially parallel to a gate width direction and is located in an end part of the rectangular substrate region surrounded by the shallow trench isolation 12a in a gate length direction. The other structures of the semiconductor device are the same as those of the second embodiment. Hereinafter, in this embodiment, a description will be given mainly of a method for forming the capacitor trench and the plate electrode as characteristic parts of this embodiment.

Figure 15A:
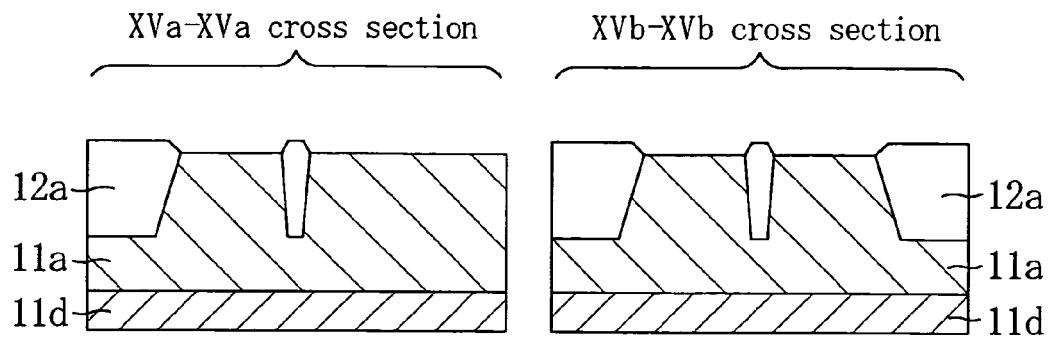
FIGS. 15A through 15D are cross sectional views taken along the lines XVa—XVa and XVb—XVb shown in FIGS. 14.

Initially, in a process step shown in FIG. 15A, the shallow trench isolation 12a is formed by forming an isolation trench and filling the isolation trench with a silicon oxide film. At this time, a trench isolation is formed also in the logic circuit region Rlogc. A deep n-well 11d, a p-well 11a, and a p-well 11c and an n-well 11b both located in the logic circuit region are formed by carrying out the process steps similar to those of the second embodiment (see FIG. 7A). Referring to FIGS. 14A through 14D, the p-well 11a and the deep n-well 11d are formed in the silicon substrate 10. However, for convenience, a body of the silicon substrate 10 is not shown therein.

Figure 15B:
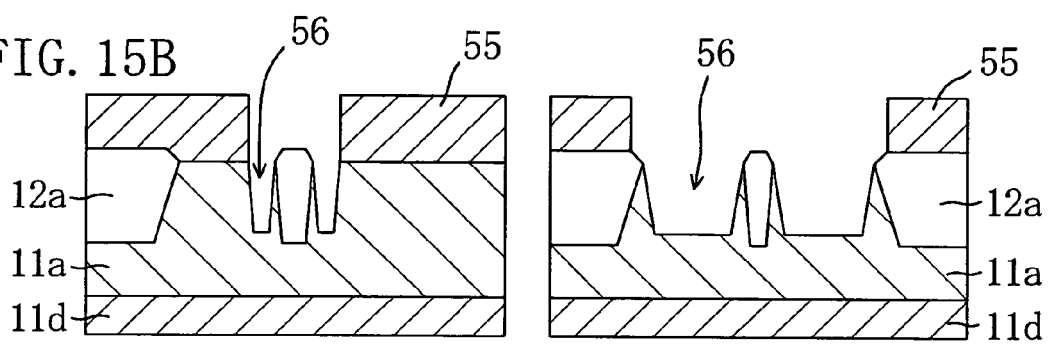

Next, in a process step shown in FIG. 15B, a resist mask 55 having a region that is to form the capacitor trench opened (see FIG. 14B) is formed on the silicon substrate 10. As shown in FIGS. 14B and 15B, an opening of the resist mask 55 lies across part of the shallow trench isolation 12a and plural active regions (substrate regions). Dry etching is performed using the resist mask 55, thereby forming a capacitor trench 56 in the silicon substrate 10. At this time, a high etching selection ratio of a silicon oxide film constructing the shallow trench isolation 12a to a silicon substrate need be ensured. Therefore, a chlorine gas (for example, HBr/Cl$_2$) is employed as an etching gas. The width of the capacitor trench 56 is 0.3 μm, for example. At this time, no capacitor trench is formed in the logic circuit region.

Figure 15C:
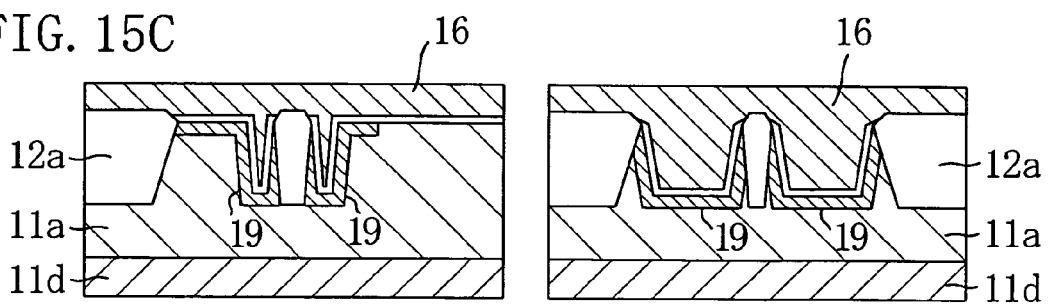

Next, in a process step shown in FIG. 15C, after the resist mask 55 is removed, a resist mask (not shown) is formed to cover a range of the substrate smaller than the transistor formation region. Thereafter, arsenic ions (As$^+$) are implanted using this resist mask as an implantation mask, thereby forming an n-type diffusion layer 19 that becomes a storage node in a region of the substrate located immediately below the wall surface of the capacitor trench 56 and its surrounding region.

Next, a thermal oxide film having a thickness of 2.9 nm, which serves as a capacitance dielectric 15 located in the memory region Rmemo and a gate dielectric 14a located in the memory region Rmemo, and a thermal oxide film having a thickness of 2 through 6 nm, which serves as a gate dielectric 14b located in the logic circuit region Rlogc (see FIG. 7A), are formed, and thereafter a polysilicon film 16 having a thickness of 200 nm is deposited thereon. The total thickness of this polysilicon film 16 and the thermal oxide film is one-half or more of the width of the capacitor trench 56.

Figure 15D:
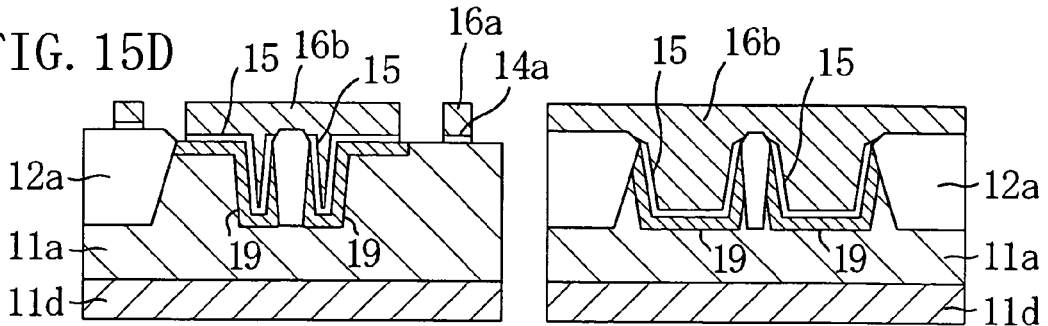

Next, in a process step shown in FIG. 15D, the capacitance dielectric 15 and a plate electrode 16b for a trench capacitor and the gate dielectric 14a and a gate electrode 16a for a memory cell transistor are formed in the memory region Rmemo by patterning the polysilicon film 16 and the thermal oxide film. In the logic circuit region Rlogc, the gate dielectric 14b and a gate electrode 16c of each of a p-channel type MIS transistor and an n-channel type MIS transistor are formed (see FIG. 7A), although they are not shown in FIG. 15D.

Although later process steps are not shown, process steps as in the fabricating method of the second embodiment are carried out. Thereby, sidewalls 25a and 25b, a high-concentration drain diffusion layer 17a, a low-concentration drain diffusion layer 17b, and a source diffusion layer 18 are formed in the memory region Rmemo, and a sidewall 26, and source/drain diffusion layers 20 and 21 are formed in the logic circuit region Rlogc.

According to the method of this embodiment, in the process step shown in FIG. 15B, etching is performed using the resist mask 55 having an opening lying over the plural active regions between which the shallow trench isolation 12a is sandwiched, so as to form the capacitor trench 56. Therefore, a specific positioning accuracy of the resist mask for the shallow trench isolation is not necessarily required, resulting in further simplifying this process step than in the fourth embodiment.

Another Embodiment

In each of the above embodiments, the memory cell may be constructed to be surrounded by the deep n-well.

Although in the above embodiments the memory cell transistor is an n-channel type transistor, the memory cell transistor may be a p-channel type transistor. When the memory cell transistor is a p-channel type transistor, a triple-well structure need not be employed. Therefore, the number of masks in the fabricating process steps can be reduced. In this case, an n-well, a p-type diffusion layer and a high-concentration p-type diffusion layer need be formed instead of the p-well 11a, the n-type diffusion layer 19 and the high-concentration drain diffusion layer 17a, respectively, and both of the source diffusion layer 18 and the low-concentration drain diffusion layer 17b of the memory cell transistor need be located in a p-type region. A well equivalent to the deep n-well 11d is not required.

An antireflection coating consisting of a SiON film or the like may be provided on the polysilicon film for forming the gate electrodes 16a and 16c and the plate electrode 16b in each of the above embodiments. In this case, in order to ensure the flatness of the stacked film above the trench, the total thickness of the antireflection coating, the polysilicon film and the capacitance dielectric is preferably one-half or more of the width of the trench. In this case, in a photolithography process step for forming a resist film to pattern the polysilicon film, the patterning accuracy of the resist film can be kept high. Therefore, this is advantageous in forming a finer transistor.

An etching hard mask consisting of an oxide film or the like may be provided on the polysilicon film for forming the gate electrodes 16a and 16c and the plate electrode 16b in each of the above embodiments. In this case, in order to ensure the flatness of the stacked film above the trench, the total thickness of an etching film, the polysilicon film and the capacitance dielectric is preferably one-half or more of the width of the trench. In this case, since the collapse of a pattern of the hard mask during etching is smaller than that of the resist mask, the patterning accuracy of the gate electrode or the like is further improved. Therefore, this is advantageous in forming a finer transistor.

The same holds true for the case where both of the hard mask and the antireflection coating are provided and the case where a film functioning as both the hard mask and the antireflection coating is provided.

The gate electrode and the plate electrode may be formed of a conductor film consisting of a film obtained by stacking a polysilicon film and a metal film (i.e., polymetal). In this case, the total thickness of the conductor film consisting of a film obtained by stacking a polysilicon film and a metal film and the capacitance dielectric, or the total thickness of the conductor film consisting of a film obtained by stacking a polysilicon film and a metal film, the capacitance dielectric film and a dielectric such as the antireflection coating need only be larger than one-half of the width of the trench.

Industrial Applicability

The semiconductor device of the present invention can be utilized for a DRAM mounted to electronic equipment, a merged DRAM/logic device or the like.

The invention claimed is:

1. A semiconductor device comprising:
 a semiconductor substrate;
 a recess formed in the semiconductor substrate;
 a memory cell transistor including a gate electrode and a gate dielectric provided on the semiconductor substrate and source and drain diffusion layers provided at either side of the gate electrode in the semiconductor substrate;
 a capacitor including a plate electrode formed of a conductor film in common with the gate electrode of the memory cell transistor so as to lie over the top surface of the semiconductor substrate and at least a part of the surface of the recess, and a capacitance dielectric provided below the plate electrode; and
 logic transistors each including a gate electrode and a gate dielectric provided on the semiconductor substrate and source and drain diffusion layers formed in the semiconductor substrate,
 wherein the plate electrode of the capacitor, the gate electrode of the memory cell transistor and the gate electrodes of the transistors located in the logic circuit are all formed of a common conductor film.

2. The semiconductor device of claim 1, wherein the capacitor further includes a diffusion layer for a storage node that is of a conductive type identical with that of each of the source and drain diffusion layers, formed so as to be opposed to the plate electrode with the capacitance dielectric sandwiched therebetween in the semiconductor substrate, and connected to either of the source and drain diffusion layers of the memory cell transistor.

3. The semiconductor device of claim 1, wherein
 the lower part of the recess is filled with a dielectric, and
 the plate electrode and the capacitance dielectric are formed on the dielectric in the recess.

4. The semiconductor device of claim 3, wherein at least one of the dielectrics in the recess is an isolation dielectric.

5. The semiconductor device of claim 1, wherein the recess is filled with the plate electrode and the capacitance dielectric.

6. The semiconductor device of claim 5, wherein the total thickness of the conductor film of which the plate electrode is formed and the capacitance dielectric is one-half or more of the width of the recess.

7. The semiconductor device of claim 5, further comprising:
- an upper dielectric provided on the conductor film for forming the plate electrode,
- wherein the total thickness of the upper dielectric, the conductor film of which the plate electrode is formed and the capacitance dielectric is one-half or more of the width of the recess.

8. The semiconductor device of claim 1, wherein the capacitance dielectric and the gate dielectric of the memory cell transistor are formed of a common film.

9. The semiconductor device of claim 1, wherein the capacitance dielectric and the gate dielectric of the memory cell transistor are formed of different films, respectively.

10. The semiconductor device of claim 1, further comprising:
- a first dielectric sidewall formed along the sides of the gate electrode; and
- a second dielectric sidewall formed along the sides of the plate electrode,
- wherein the first dielectric sidewall and the second dielectric sidewall are formed of a common dielectric.

11. The semiconductor device of claim 1, wherein the source diffusion layer is covered with the first dielectric sidewall and the second dielectric sidewall.

* * * * *